(12) United States Patent
Jeon et al.

(10) Patent No.: US 9,984,925 B2
(45) Date of Patent: May 29, 2018

(54) SEMICONDUCTOR DEVICE AND METHOD FOR FABRICATING THE SAME

(71) Applicant: SAMSUNG ELECTRONICS CO., LTD., Suwon-si, Gyeonggi-do (KR)

(72) Inventors: Yong-Ho Jeon, Hwaseong-si (KR); Sang-Su Kim, Yongin-si (KR); Cheol Kim, Hwaseong-si (KR); Yong-Suk Tak, Seoul (KR); Myung-Geun Song, Yongin-si (KR); Gi-Gwan Park, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/182,024

(22) Filed: Jun. 14, 2016

(65) Prior Publication Data
US 2017/0103916 A1    Apr. 13, 2017

(30) Foreign Application Priority Data
Oct. 8, 2015 (KR) .......................... 10-2015-0141523

(51) Int. Cl.
| | |
|---|---|
| *H01L 21/768* | (2006.01) |
| *H01L 21/8238* | (2006.01) |
| *H01L 23/535* | (2006.01) |
| *H01L 27/092* | (2006.01) |
| *H01L 29/08* | (2006.01) |
| *H01L 29/16* | (2006.01) |

(Continued)

(52) U.S. Cl.
CPC ............... *H01L 21/76897* (2013.01); *H01L 21/823814* (2013.01); *H01L 21/823821* (2013.01); *H01L 21/823842* (2013.01); *H01L 21/823864* (2013.01); *H01L 21/823871* (2013.01); *H01L 23/535* (2013.01); *H01L 27/0924* (2013.01); *H01L 29/0847* (2013.01); *H01L 29/161* (2013.01); *H01L 29/165* (2013.01); *H01L 29/1608* (2013.01); *H01L 29/4966* (2013.01); *H01L 29/66545* (2013.01); *H01L 29/7848* (2013.01)

(58) Field of Classification Search
CPC .................................................. H01L 29/7831
See application file for complete search history.

(56) References Cited

U.S. PATENT DOCUMENTS

| | | | |
|---|---|---|---|
| 8,906,760 B2 | 12/2014 | Ranjan et al. | |
| 9,112,032 B1 * | 8/2015 | Liu | ................... H01L 29/66795 |

(Continued)

*Primary Examiner* — Yu-Hsi D Sun
(74) *Attorney, Agent, or Firm* — Lee & Morse, P.C.

(57) ABSTRACT

A semiconductor device, including a first fin-type pattern; a first gate spacer on the first fin-type pattern, intersecting the first fin-type pattern, and including an upper portion and a lower portion; a second gate spacer on the first fin-type pattern, intersecting the first fin-type pattern, and being spaced apart from the first gate spacer; a first trench defined by the first gate spacer and the second gate spacer; a first gate electrode partially filling the first trench; a first capping pattern on the first gate electrode and filling the first trench; and an interlayer insulating layer covering an upper surface of the capping pattern, a width of the upper portion of the first gate spacer decreasing as a distance from an upper surface of the first fin-type pattern increases, and an outer sidewall of the upper portion of the first gate spacer contacting the interlayer insulating layer.

12 Claims, 20 Drawing Sheets

(51) Int. Cl.
*H01L 29/161* (2006.01)
*H01L 29/165* (2006.01)
*H01L 29/49* (2006.01)
*H01L 29/66* (2006.01)
*H01L 29/78* (2006.01)

(56) References Cited

U.S. PATENT DOCUMENTS

| | | |
|---|---|---|
| 2006/0121721 A1 | 6/2006 | Lee et al. |
| 2009/0075474 A1 | 3/2009 | Lee et al. |
| 2014/0252497 A1 | 9/2014 | Peng et al. |
| 2014/0374827 A1 | 12/2014 | Suh et al. |
| 2015/0041909 A1 | 2/2015 | Bouche et al. |
| 2015/0069473 A1 | 3/2015 | Glass et al. |
| 2015/0144998 A1 | 5/2015 | Ching et al. |
| 2015/0162333 A1 | 6/2015 | Kuo et al. |
| 2015/0187594 A1 | 7/2015 | Tu et al. |

* cited by examiner

SEMICONDUCTOR DEVICE AND METHOD FOR FABRICATING THE SAME

CROSS-REFERENCE TO RELATED APPLICATION

Korean Patent Application No. 10-2015-0141523, filed on Oct. 8, 2015, in the Korean Intellectual Property Office, and entitled: "Semiconductor Device and Method for Fabricating the Same," is incorporated by reference herein in its entirety.

BACKGROUND

1. Field

The present disclosure relates to a semiconductor device and a method for fabricating the same.

2. Description of the Related Art

An increase in the distribution of information media may lead into remarkable advancement in the functionalities of semiconductor devices. To ensure higher competitiveness, new semiconductor products may be required to meet demands for lower cost and higher quality by way of higher integration. The semiconductor scale-down may continue to achieve higher integration.

SUMMARY

Embodiments are directed to a semiconductor device, including a first fin-type pattern; a first gate spacer on the first fin-type pattern, the first gate spacer intersecting the first fin-type pattern and including an upper portion and a lower portion; a second gate spacer on the first fin-type pattern, the second gate spacer intersecting the first fin-type pattern and being spaced apart from the first gate spacer; a first trench defined by the first gate spacer and the second gate spacer; a gate insulating layer along a bottom surface and a sidewall of the first trench; a first gate electrode on the gate insulating layer, the first gate electrode partially filling the first trench; a first capping pattern on the first gate electrode, the first capping pattern filling the first trench; and an interlayer insulating layer covering an upper surface of the capping pattern, a width of the upper portion of the first gate spacer decreasing as a distance from an upper surface of the first fin-type pattern increases, and an outer sidewall of the upper portion of the first gate spacer contacting the interlayer insulating layer.

The semiconductor device may further include a source/drain region adjacent to the first gate spacer, the source/drain region being within the first fin-type pattern. A self-aligned contact vertically overlapped with the first source/drain region, may not be formed.

The first capping pattern may include a different material from the upper portion of the first gate spacer.

A height of the upper portion of the first gate spacer may be less than a height of the capping pattern.

The lower portion of the first gate spacer may be on a portion of the sidewall of the first capping pattern, and on the sidewall of the first gate electrode.

The semiconductor device may further include an insert spacer between a lower surface of the first gate spacer and the first fin-type pattern, and between a lower surface of the second gate spacer and the first fin-type pattern. The insert spacer may include a different material from the first gate spacer.

The lower portion of the first gate spacer and the upper portion of the first gate spacer may include a same material.

The semiconductor device may further include a protruding spacer protruding from a sidewall of the lower portion of the first gate spacer into the interlayer insulating layer. The protruding spacer may include a different material from the lower portion of the first gate spacer, and may include a same material as the upper portion of the first gate spacer.

A height of the first gate spacer and a height of the second gate spacer may be different from each other.

The semiconductor device may further include source/drain region adjacent to the second gate spacer, the source/drain region being within the first fin-type pattern, and a self-aligned contact vertically overlapped with the source/drain region, the self-aligned contact contacting the second gate spacer.

Embodiments are directed to a semiconductor device, including a first fin-type pattern on a substrate; a second fin-type pattern adjacent to the first fin-type pattern, the second fin-type pattern being parallel to the first fin-type pattern; a first gate spacer intersecting the first fin-type pattern and the second fin-type pattern; a second gate spacer intersecting the first fin-type pattern and the second fin-type pattern, the second gate spacer being spaced apart from the first gate spacer; a trench defined by the first gate spacer and the second gate spacer; a gate electrode intersecting the first fin-type pattern and the second fin-type pattern, the gate electrode partially filling the trench; a capping pattern on the gate electrode, the capping pattern filling the trench; and a self-aligned contact contacting the first spacer, the self-aligned contact self-aligned contact being in a self-aligned contact forming region of the substrate, the self-aligned contact contacting the first spacer not being in a self-aligned contact non-forming region that is adjacent to the self-aligned contact forming region of the substrate, and in the self-aligned contact non-forming region, the first gate spacer including an upper portion decreasing, in width, as a distance from the upper surface of the first fin-type pattern increases.

In the self-aligned contact non-forming region, the upper portion of the first gate spacer may have a triangular shape.

The capping pattern may include a material having an etch selectivity to the upper portion of the first gate spacer.

A height of the lower portion of the first gate spacer in the self-aligned contact non-forming region may be equal to or greater than the height of the lower portion of the first gate spacer in the self-aligned contact forming region.

The semiconductor device may further include a gate insulating layer along a sidewall and a bottom surface of the trench.

Embodiments are directed to a semiconductor device, including a first fin-type pattern; a first gate spacer on the first fin-type pattern; a second gate spacer on the first fin-type pattern, a height of the first gate spacer being greater than a height of the second gate spacer; a first trench defined by the first gate spacer and the second gate spacer; a gate insulating layer along a bottom surface and a sidewall of the first trench; a first gate electrode on the gate insulating layer, the first gate electrode partially filling the first trench; and a capping pattern on the first gate electrode.

The first gate spacer may include an upper portion and a lower portion, and a width of the upper portion of the first gate spacer may decrease as a distance from an upper surface of the first fin-type pattern increases.

A height of the lower portion of the first gate spacer may be greater than a height of the second gate spacer.

A height of the upper portion of the first gate spacer may be less than a height of the capping pattern.

Each of the first gate spacer and the second gate spacer may include SiOCN; and the capping pattern may include SiN.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
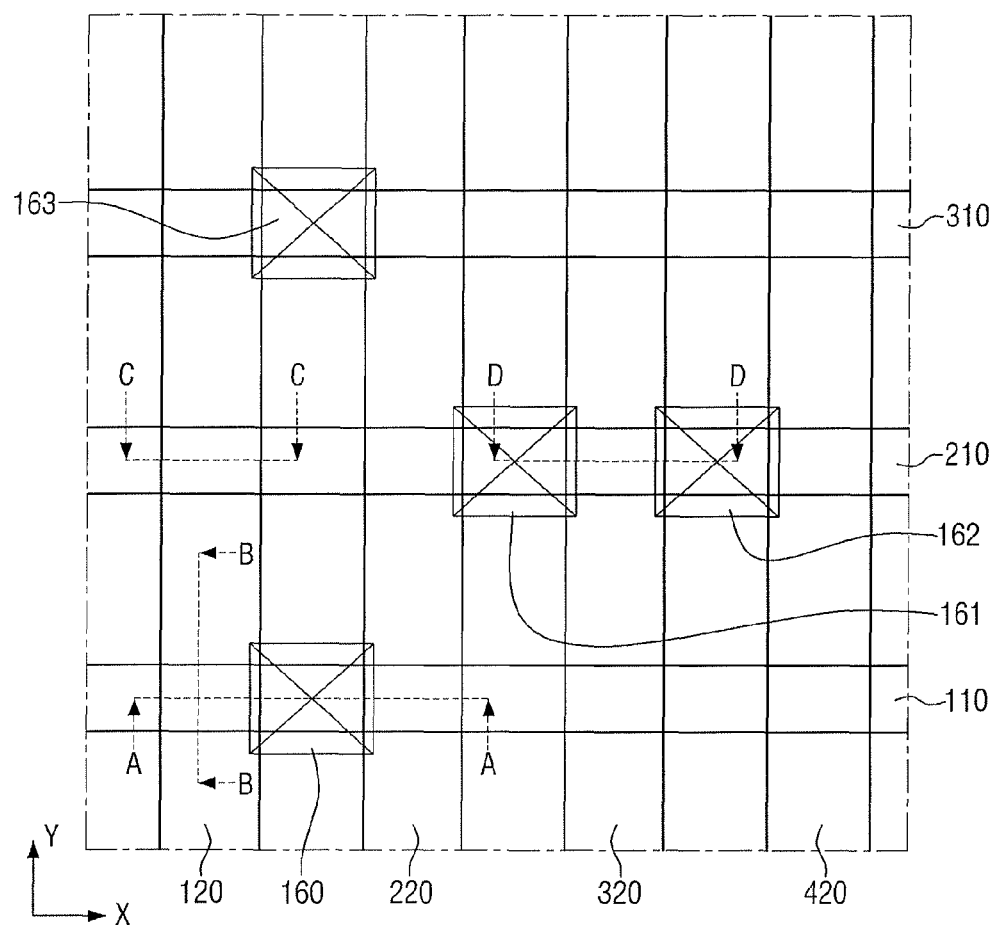
FIG. 1 illustrates a layout diagram provided to explain a semiconductor device according to some exemplary embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc., may be used herein to describe various elements, these elements should not be limited by these terms. These terms are only used to distinguish one element from another element. Thus, for example, a first element, a first component or a first section discussed below could be termed a second element, a second component or a second section.

The use of the terms "a" and "an" and "the" and similar referents in the context of describing embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of skill in the art. It is noted that the use of any and all examples, or exemplary terms provided herein is intended merely to better illuminate embodiments and is not a limitation on the scope of embodiments unless otherwise specified. Further, unless defined otherwise, all terms defined in generally used dictionaries may not be overly interpreted.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

The drawings regarding a semiconductor device according to some exemplary embodiments exemplify, for example, a fin-type transistor including a channel region in a fin-type pattern shape. It may be possible that a semiconductor device according to some exemplary embodiments may include a tunneling field-effect transistor (FET), a transistor including nanowire, a transistor including nanosheet, or a three-dimensional (3D) transistor. A semiconductor device according to some exemplary embodiments may include, for example, a bipolar junction transistor or a laterally diffused metal oxide semiconductor (LDMOS) transistor.

Moreover, while a semiconductor device according to some exemplary embodiments is exemplified as a multichannel transistor using fin-type pattern, the semiconductor device may be a planar transistor as well.

Hereinafter, a semiconductor device according to some exemplary embodiments will be explained with reference to FIGS. 1 to 4.

Figure 2:
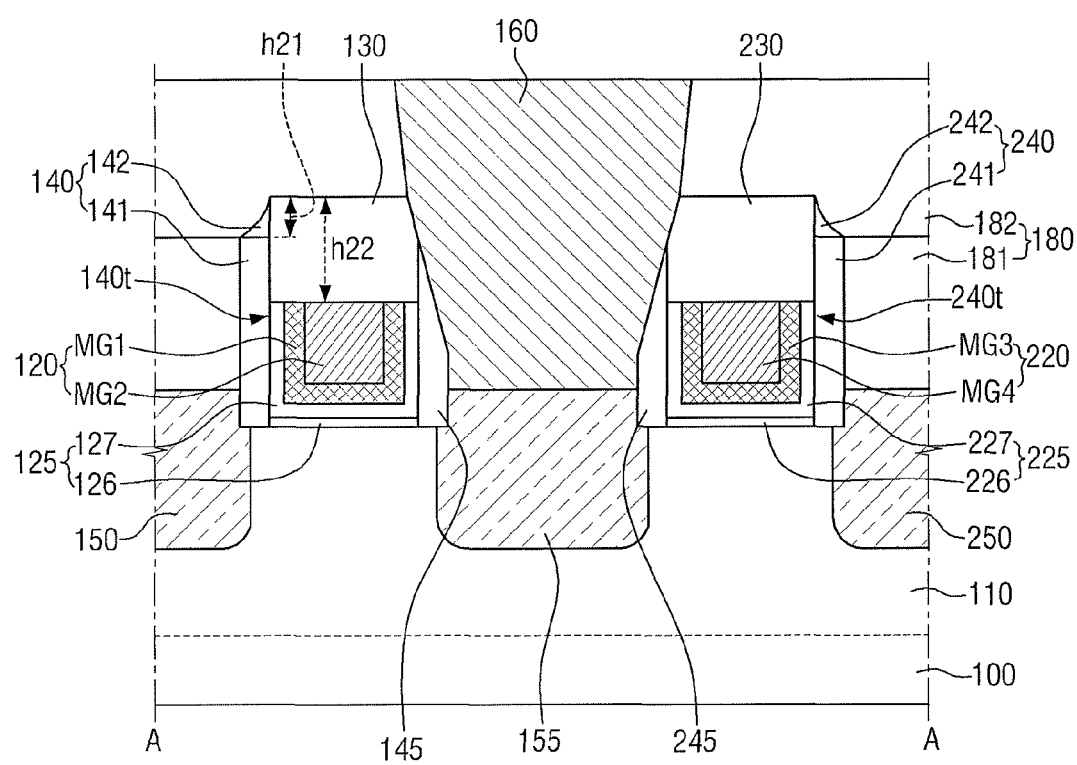
FIG. 2 illustrates a cross sectional view taken on line A-A of FIG. 1.
Figure 3A:
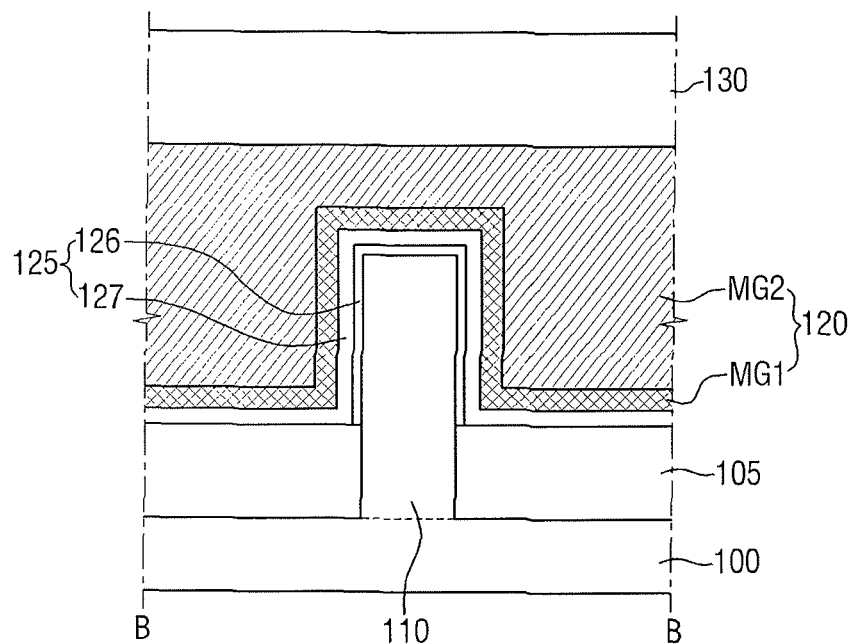
FIGS. 3A and 3B illustrate cross sectional views taken on line B-B of FIG. 1.
Figure 3B:
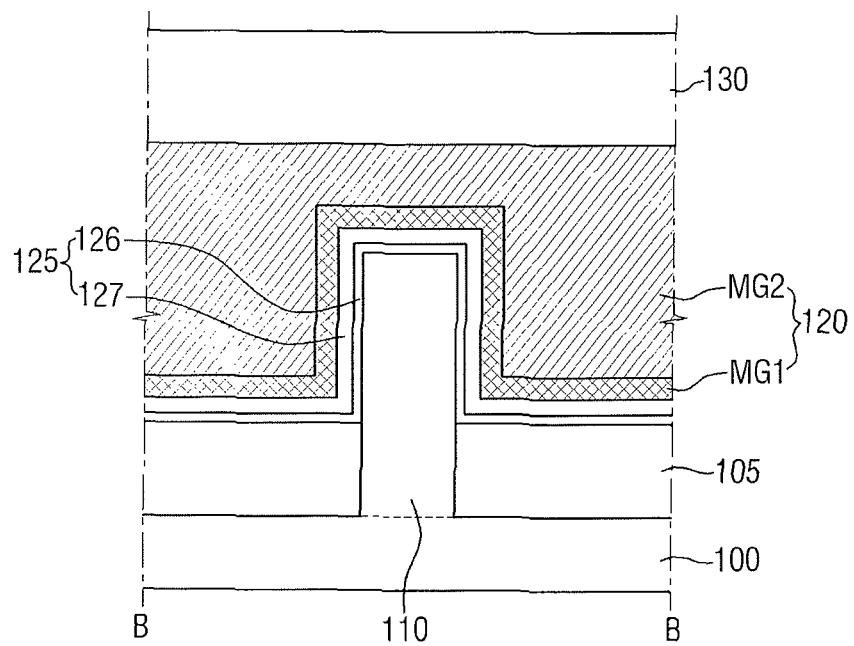
Figure 3C:
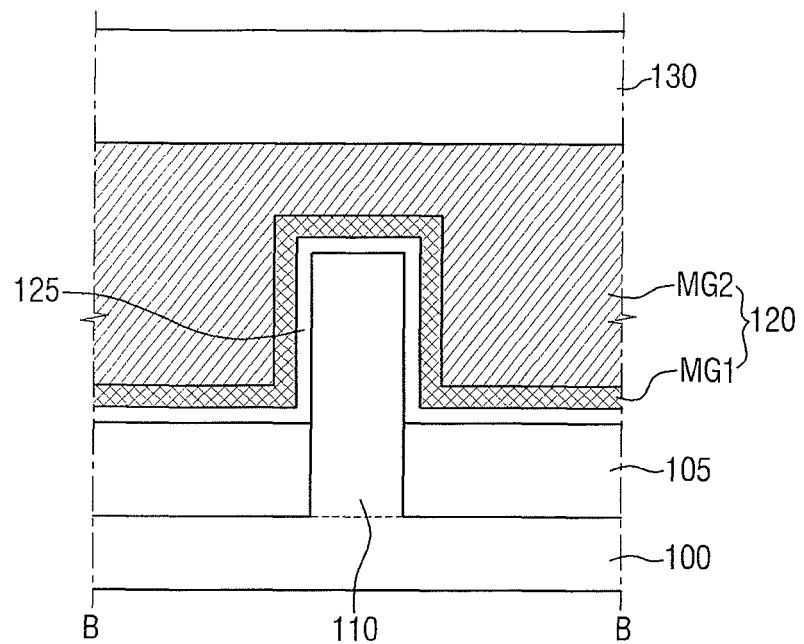
FIG. 3C illustrates a view provided to explain a modified example of FIG. 3A.
Figure 4:
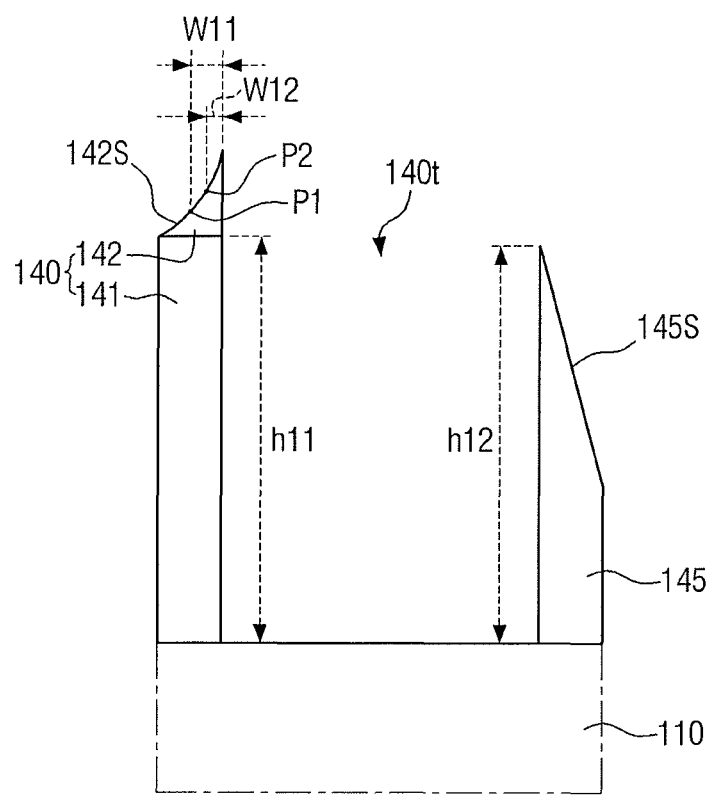
FIG. 4 illustrates a view of a first gate spacer and second gate spacer of FIG. 2.

FIG. 1 illustrates a layout diagram provided to explain a semiconductor device according to some exemplary embodiments. FIG. 2 illustrates a cross sectional view taken on line A-A of FIG. 1. FIGS. 3A and 3B illustrate cross sectional views taken on line B-B of FIG. 1. FIG. 3C illustrates a view provided to explain a modified example of FIG. 3A. FIG. 4 illustrates a view of a first gate spacer and second gate spacer of FIG. 2.

Referring to FIGS. 1 to 4, a semiconductor device according to some exemplary embodiments may include a plurality of fin-type patterns 110, 210, 310, a plurality of gate electrodes 120, 220, 320, 420, and a plurality of self-aligned contacts 160, 161, 162, 163.

The substrate 100 may be a bulk silicon or a silicon-on-insulator (SOI). In an embodiment, the substrate 100 may be a silicon substrate, or may include other substance such as, for example, silicon germanium, silicon germanium on insulator (SGOI), indium antimonide, lead telluride compound, indium arsenide, indium phosphide, gallium arsenide, or gallium antimonide.

The substrate 100 may include a self-aligned contact forming region, and a self-aligned contact non-forming region.

The 'self-aligned contact forming region' as used herein refers to a region where a plurality of self-aligned contacts 160, 161, 162, 163 are made. The 'self-aligned contact non-forming region' as used herein refers to a region that is other than a region where a plurality of self-aligned contacts 160, 161, 162, 163 are made.

As illustrated in FIG. 1, a plurality of self-aligned contacts 160, 161, 162, 163 may be formed between adjacent gate electrodes and on a portion overlapping the fin-type pattern, for example.

The first fin-type pattern 110 may protrude from the substrate 100. The first fin-type pattern 110 may extend longitudinally in a first direction X.

The 'first fin-type pattern 110' refers herein to an active pattern used in a multigate transistor, and the first fin-type pattern 110 may be formed as the channels are connected with each other along three surfaces of the fin, or in an embodiment, formed as the channels are formed on two opposing surfaces of the fin.

The first fin-type pattern 110 may be a part of the substrate 100, and may include an epitaxial layer grown on the substrate 100.

The first fin-type pattern 110 may include an element semiconductor material such as silicon or germanium, for example. The first fin-type pattern 110 may include a compound semiconductor such as, for example, IV-IV group compound semiconductor or III-V group compound semiconductor.

For example, with respect to the IV-IV group compound semiconductor, the first fin-type pattern 110 may be a binary compound or a ternary compound including, for example, at least two or more of carbon (C), silicon (Si), germanium (Ge), and tin (Sn), or the above-mentioned binary or ternary compound doped with IV group element.

For example, with respect to the III-V group compound semiconductor, the first fin-type pattern 110 may be a binary compound, a ternary compound or a quaternary compound, which may be formed by a combination of a III group element, which may be one or more of aluminum (Al), gallium (Ga), or indium (In), with a V group element which may be one of phosphorus (P), arsenic (As), and antimony (Sb).

The second fin-type pattern 210 and the third fin-type pattern 310 may protrude from the substrate 100. The second fin-type pattern 310 and the third fin-type pattern 310 may extend longitudinally in the first direction X. Description of the second fin-type pattern 210 and the third fin-type pattern 310 may be substantially identical to that of the first fin-type pattern 110.

The first to the third fin-type patterns 110, 210, 310 may be aligned abreast, e.g., parallel to each other, in the second direction Y.

A field insulating layer 105 may be formed on the substrate 100. The field insulating layer 105 may partially cover a side surface of the first fin-type pattern 110, and an upper surface of the first fin-type pattern 110 may protrude upward higher than an upper surface of the field insulating layer 105.

Like the first fin-type pattern 110, the field insulating layer 105 may partially cover the sidewall of the second fin-type pattern 210 and the sidewall of the third fin-type pattern 310.

The first to the third fin-type patterns 110, 210, 310 may each be defined by the field insulating layer 105 on the substrate 100.

The field insulating layer 105 may include, for example, one of oxide layer, nitride layer, oxynitride layer, and a combination thereof.

The first gate spacer 140 and the second gate spacer 145 may be formed on the first fin-type pattern 110 and the field insulating layer 105, respectively. The first gate spacer 140 and the second gate spacer 145 may extend in the second direction Y, and may intersect the first fin-type pattern 110.

The first gate spacer 140 and the second gate spacer 145 may also intersect the second fin-type pattern 210 and the third fin-type pattern 310.

The first gate spacer 140 and the second gate spacer 145 may be spaced apart from each other. The first gate spacer 140 and the second gate spacer 145 may define a first trench 140*t*. An inner sidewall of the first gate spacer 140 and an inner sidewall of the second gate spacer 145 may each define the sidewall of the first trench 140*t*.

The third gate spacer 240 and the fourth gate spacer 245 may be formed on the first fin-type pattern 110 and the field insulating layer 105, respectively. The third gate spacer 240 and the fourth gate spacer 245 may extend in the second direction Y, and may intersect the first to the third fin-type patterns 110, 210, 310.

The third gate spacer 240 and the fourth gate spacer 245 may be spaced apart from each other. An inner sidewall of the third gate spacer 240 and an inner sidewall of the fourth gate spacer 245 may define the sidewall of the second trench 240*t*.

The first gate insulating layer 125 may be formed along the sidewall and the bottom surface of the first trench 140*t*. The first gate insulating layer 125 may be formed on the inner sidewall of the first gate spacer 140, the first fin-type pattern 110, and the inner sidewall of the second gate spacer 145.

The first gate insulating layer 125 may also be formed on the second fin-type pattern 210 and the third fin-type pattern 310.

The first gate insulating layer 125 may include a first interfacial layer 126 and a first high-k dielectric insulating layer 127.

As illustrated in FIG. 3A, the first interfacial layer 126 may be formed on the first fin-type pattern 110 protruding upward higher than the upper surface of the field insulating layer 105. The first fin-type pattern 110 may include silicon, and the first interfacial layer 126 may include a silicon oxide layer. The material included in the first interfacial layer 126 may vary depending on a material of the first fin-type pattern 110.

As illustrated in FIG. 3B, the first interfacial layer 126 may also be formed along the upper surface of the field insulating layer 105.

Unlike the illustration, as required by a method for forming the first interfacial layer 126, the first interfacial layer 126 may include a portion that extends along an inner sidewall of the first gate spacer 140 and an inner sidewall of the second gate spacer 145.

For example, the first high-k dielectric insulating layer 127 may include one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate. While the oxides are mainly described with respect to the first high-k dielectric insulating layer 127 described above, in an embodiment, the first high-k dielectric insulating layer 127 may include one or more of the nitride (e.g., hafnium nitride) or the oxynitride (e.g., hafnium oxynitride) of the metal materials described above, for example.

In an embodiment, the first gate insulating layer 125 may not include an interfacial layer, as illustrated in FIG. 3C.

The second gate insulating layer 225 may be formed along the sidewall and the bottom surface of the second trench 240t. The second gate insulating layer 225 may be formed on the inner sidewall of the third gate spacer 240, the first fin-type pattern 110, and the inner sidewall of the fourth gate spacer 245.

The second gate insulating layer 225 may also be formed on the second fin-type pattern 210 and the third fin-type pattern 310.

The second gate insulating layer 225 may include a second interfacial layer 126 and a second high-k dielectric insulating layer 227.

The first gate electrode 120 may extend in the second direction Y. The first gate electrode 120 may be formed on the first fin-type pattern 110 and the field insulating layer 105. The first gate electrode 120 may surround the first fin-type pattern 110 protruding upward higher than the upper surface of the field insulating layer 105.

The first gate electrode 120 may be formed on the first gate insulating layer 125. The first gate electrode 120 may partially fill the first trench 140t.

The first gate electrode 120 may include metal layers MG1, MG2. For example, the first gate electrode 120 may include a stack of two or more metal layers MG1, MG2, as illustrated. The first metal layer MG1 plays a role of adjusting a work function, and the second metal layer MG2 plays a role of filling a space defined by the first metal layer MG1.

For example, the first metal layer MG1 may include one or more of, for example, TiN, WN, Ru, TiAl, TiAlN, TiAlC—N TaN, TiAlC, TiC, TaC, TaCN, TaSiN, or a combination thereof, or include an oxide thereof. The second metal layer MG2 may include one or more of, for example, W, Al, Cu, Co, Ti, Ta, Ni, Pt, Ni—Pt, poly-Si, SiGe, or a metal alloy.

The second gate electrode 220 may extend in the second direction Y. The second gate electrode 220 may be formed on the second gate insulating layer 225. The second gate electrode 220 may partially fill the second trench 240t.

The second gate electrode 220 may include metal layers MG3, MG4. Description of the second gate electrode 220 may be substantially similar to that of the first gate electrode.

The first gate electrode 120 and the second gate electrode 220 may each be formed by, for example, replacement process (or gate last process).

The first capping pattern 130 may be formed on the first gate electrode 120 and the first gate insulating layer 125. The first capping pattern 130 may be formed by partially filling the first trench 140t.

For example, the first gate electrode 120 partially may fill the first trench 140t, and the first capping pattern 130 may fill the rest of the first trench 140t, which is not filled by the first gate electrode 120.

The second capping pattern 230 may be formed on the second gate electrode 220 and the second gate insulating layer 225. The second capping pattern 230 may be formed by partially filling the second trench 240t.

For example, the second gate electrode 220 partially may fill the second trench 240t, and the second capping pattern 230 may fill the rest of the second trench 240t, which is not filled by the second gate electrode 220.

As illustrated in FIG. 2, the first gate insulating layer 125 may not extend between the sidewall of the first capping pattern 130 and the first gate spacer 140, nor between the sidewall of the first capping pattern 130 and the second gate spacer 145, for example.

Unlike the illustration, a portion of the first gate insulating layer 125 may be positioned between the sidewall of the first capping pattern 130 and the first gate spacer 140, and between the sidewall of the first capping pattern 130 and the second gate spacer 145.

The first source/drain region 150 may be formed adjacent to the first gate spacer 140. The first source/drain region 150 may be formed within the first fin-type pattern 110. The first source/drain region 150 may be an elevated source/drain.

The second source/drain region 155 may be formed adjacent to the second gate spacer 145. The second source/drain region 155 may be formed adjacent to the fourth gate spacer 245. For example, the second source/drain region 155 may be formed between the second gate spacer 145 and the fourth gate spacer 245. The second source/drain region 155 may be formed within the first fin-type pattern 110.

The third source/drain region 250 may be formed adjacent to the third gate spacer 240. The third source/drain region 250 may be formed within the first fin-type pattern 110.

The first source/drain region 150 and the second source/drain region 155 may be formed adjacent to the first gate electrode 120. The second source/drain region 155 and the third source/drain region 250 may be formed adjacent to the second gate electrode 220.

Each of the first to the third source/drain regions 150, 155, 250 may include an epitaxial layer formed within the first fin-type pattern 110.

The semiconductor device according to some exemplary embodiments may be a p-channel metal-oxide semiconductor (PMOS) transistor, and the epitaxial layer 145 may include a compressive stress material. For example, the compressive stress material may be a material of larger lattice constant than the material included in the first fin-type pattern 110. For example, the first fin-type pattern 110 may be a silicon fin-type pattern, and the epitaxial layer may be SiGe. For example, the compressive stress material may enhance mobility of the carrier in the channel region by exerting compressive stress on the first fin-type pattern 110.

In an embodiment, the semiconductor device according to some exemplary embodiments may be an n-type metal-oxide semiconductor (NMOS) transistor, and the epitaxial layer may include a tensile stress material. For example, the first fin-type pattern 110 may be a silicon fin-type pattern, and the epitaxial layer may be a material such as SiC that has a smaller lattice constant than the silicon. For example, the tensile stress material may enhance mobility of the carrier in the channel region by exerting tensile stress on the first fin-type pattern 110. In an embodiment, the epitaxial layer included in the NMOS transistor may include the same material as the first fin-type pattern 110.

The interlayer insulating layer 180 may be formed on the substrate 100. The interlayer insulating layer 180 surrounds an outer sidewall of the first gate spacer 140 and an outer sidewall of the second gate spacer 145, which define the first trench 140t, and surrounds an outer sidewall of the third gate spacer 240 and an outer sidewall of the fourth gate spacer 245, which define the second trench 240t.

The interlayer insulating layer 180 may cover an upper surface of the first capping pattern 130 and an upper surface of the second capping pattern 230.

The interlayer insulating layer 180 may include a lower interlayer insulating layer 181 and an upper interlayer insulating layer 182.

The lower interlayer insulating layer 181 may partially surround the outer sidewalls of the first to the fourth gate spacers 140, 145, 240, 245.

The upper interlayer insulating layer 182 may cover the rest of the outer sidewalls of the first to the fourth gate spacers 140, 145, 240, 245, and the upper surface of the first capping pattern 130 and the upper surface of the second capping pattern 230.

The lower interlayer insulating layer 181 and the upper interlayer insulating layer 182 may each include one or more of, for example, silicon oxide, silicon nitride, silicon oxynitride, or a low-k dielectric material. For example, the low-k dielectric material may include flowable oxide (FOX), Tonen silazen (TOSZ), undoped silica glass (USG), boro-silica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SILK, polyimide, porous polymeric material, or a combination thereof.

The first self-aligned contact 160 may be formed within the interlayer insulating layer 180. At least a portion of the first self-aligned contact 160 may be overlapped vertically with the second source/drain region 155.

The first self-aligned contact 160 may be formed between the first capping pattern 130 and the second capping pattern 230, and between the second gate spacer 145 and the fourth gate spacer 245. The first self-aligned contact 160 may be aligned by the first capping pattern 130, the second capping pattern 230, the second gate spacer 145, and the fourth gate spacer 245.

For example, the first self-aligned contact 160 may include one or more of aluminum (Al), tungsten (W), copper (Cu), or cobalt (Co).

Referring to a cross sectional view shown in FIG. 2, one side of the first gate electrode 120 formed with the first gate spacer 140 may be the self-aligned contact non-forming region, and the other side of the first gate electrode 120 formed with the second gate spacer 145 may be the self-aligned contact forming region.

The first self-aligned contact 160 may be formed in the self-aligned contact forming region of the substrate 100. The first self-aligned contact 160 may contact the second gate spacer 145 and the fourth gate spacer 245.

With reference to the first gate electrode 120, the location that corresponds to the portion where the first self-aligned contact 160 is positioned, may be the self-aligned contact non-forming region, and the self-aligned contact overlapped vertically with the first source/drain region 150 may be not formed on the first source/drain region 150.

With reference to the first gate electrode 120, no self-aligned contact may be formed on one side of the first gate electrode 120, while the first self-aligned contact 160 may be formed on the other side of the first gate electrode 120, and the first gate spacer 140 and the second gate spacer 145 may have different shapes from each other.

The gate spacers may have different shapes from each other in the self-aligned contact forming region and the self-aligned contact non-forming region.

As illustrated in FIGS. 2 and 4, in the self-aligned contact non-forming region, the first gate spacer 140 may include a lower portion 141 and an upper portion 142 positioned in a sequential order on the upper surface of the first fin-type pattern 110.

As the distance increases farther away from the upper surface of the first fin-type pattern 110, the width of the upper portion 142 of the first gate spacer may decrease.

For example, an outer sidewall 142S of the upper portion 142 of the first gate spacer may include a first point P1 and a second point P2. The first point P1 may be at a farther distance away from the upper surface of the first fin-type pattern 110 than is the second point P2.

The width W11 of the upper portion 142 of the first gate spacer in the first point P1 may be greater than the width W12 of the upper portion 142 of the first gate spacer in the second point P2. For example, the upper portion 142 of the first gate spacer may have a triangular shape. As illustrated in FIG. 4, the outer sidewall 142S of the upper portion 142 of the first gate spacer may have a concaved surface, for example. An outer sidewall 145S may include an inclined upper portion and a parallel lower portion with respect to an inner sidewall of the second gate spacer 145.

In the self-aligned contact non-forming region, the outer sidewall 142S of the upper portion 142 of the first gate spacer may contact the interlayer insulating layer 180.

For example, the outer sidewall 142S of the upper portion 142 of the first gate spacer may contact the upper interlayer insulating layer 182 covering the upper surface of the first capping pattern 130. In view of the fabrication process, the upper portion 142 of the first gate spacer may be formed after the lower interlayer insulating layer 181 is formed.

No self-aligned contact may be formed in the self-aligned contact non-forming region, and the outer sidewall 142S of the upper portion 142 of the first gate spacer may contact the interlayer insulating layer 180.

In the self-aligned contact forming region, the second gate spacer 145 may not include a portion that may correspond to the upper portion 142 of the first gate spacer. In the contact hole process to form the first self-aligned contact 160, the portion of the second gate spacer 145 that may correspond to the upper portion 142 of the first gate spacer may be etched away.

The height (h11+h21) of the first gate spacer 140 in the self-aligned contact non-forming region may be greater than the height (h12) of the second gate spacer 145 in the self-aligned contact forming region.

In the contact hole process to form the first self-aligned contact 160, a portion corresponding to the lower portion 141 of the first gate spacer may be partially etched, and the height (h11) of the lower portion 141 of the first gate spacer in the self-aligned contact non-forming region may be equal to or greater than the height (h12) of the second gate spacer 145 in the self-aligned contact forming region.

The height (h21) of the upper portion 142 of the first gate spacer is less than the height (h22) of the first capping pattern 130. The lower portion 141 of the first gate spacer may be formed on a portion of the sidewall of the first capping pattern 130 and on the sidewall of the first gate electrode 120.

The lower portion of the first gate spacer 141 and the second gate spacer 145 may include one or more of, for example, silicon nitride (SiN), silicon oxynitride (SiON), silicon oxide (SiO$_2$), or silicon oxycarbon nitride (SiOCN).

For example, the upper portion 142 of the first gate spacer may include one or more of silicon nitride (SiN), silicon oxynitride (SiON), silicon oxide (SiO$_2$), silicon carbon nitride (SiCN), silicon oxycarbon nitride (SiOCN), silicon boron nitride (SiBN), silicon oxyboron nitride (SiOBN), or silicon oxycarbide (SiOC).

For example, the first capping pattern 130 may include one or more of silicon nitride (SiN), silicon oxynitride (SiON), silicon oxide (SiO$_2$), silicon carbon nitride (SiCN), or silicon oxycarbon nitride (SiOCN).

The upper portion 142 of the first gate spacer and the lower portion 141 of the first gate spacer may be formed through different fabrication processes from each other, and the upper portion 142 of the first gate spacer and the lower portion 141 of the first gate spacer may include different materials from each other, or may include same material as each other.

In some exemplary embodiments described herein with reference to FIGS. 1 to 4, the upper portion 142 of the first gate spacer and the lower portion 141 of the first gate spacer may include different materials from each other.

In a semiconductor device according to some exemplary embodiments, the upper portion 142 of the first gate spacer may include a different material from the first capping pattern 130. While the upper portion 142 of the first gate spacer is being formed, the first capping pattern 130 may need tolerance against etch processing, and the first capping pattern 130 may include a material having an etch selectivity relative to the upper portion 142 of the first gate spacer. In other words, the first capping pattern 130 may be more resistant to the etching process for the upper portion 142.

The first capping pattern 130 and the second gate spacer 145 may play a role of a guide to form the first self-aligned contact 160, and the first capping pattern 130 and the second gate spacer 145 may include a material having an etch selectivity relative to the lower interlayer insulating layer 181 and the upper interlayer insulating layer 182.

In the self-aligned contact non-forming region, the self-aligned contact vertically overlapped with the third source/drain region 250 may not be formed, and like the first gate spacer 140, the third gate spacer 240 may include an upper portion 242 and a lower portion 241.

Description of the third gate spacer 240 and the fourth gate spacer 245 may be substantially identical to the description of the corresponding first gate spacer 140 and second gate spacer 145.

Figure 5:
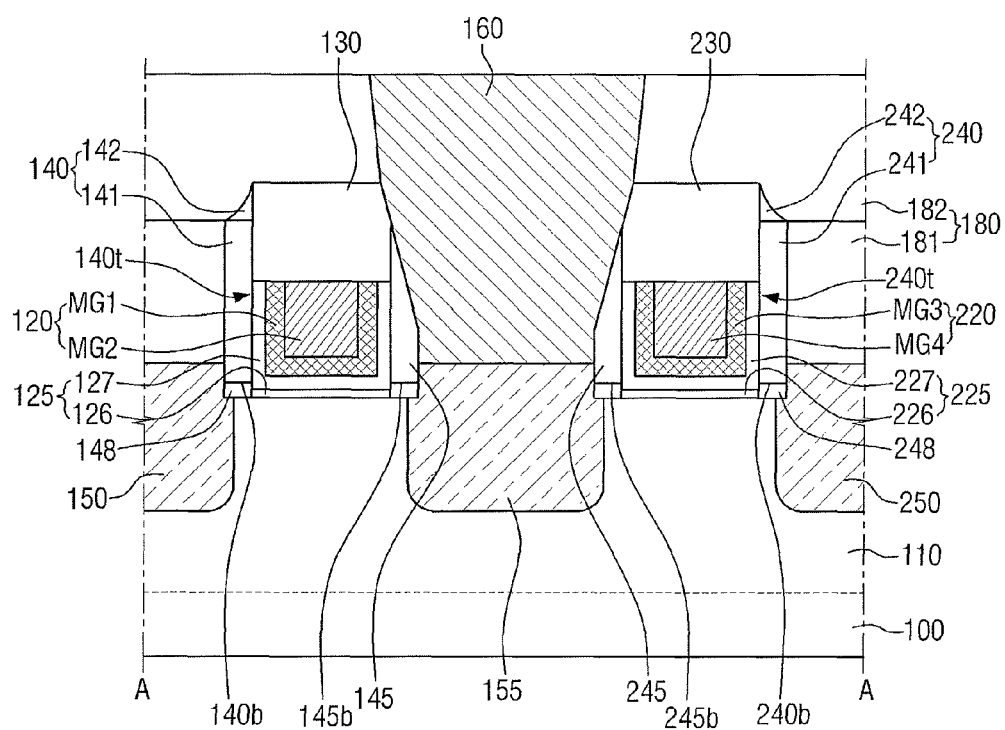
FIG. 5 illustrates a view provided to explain a semiconductor device according to some exemplary embodiments.

FIG. 5 illustrates a view provided to explain a semiconductor device according to some exemplary embodiments.

For convenience of explanation, differences that are not explained above with reference to FIGS. 1 to 4 will be mainly explained below.

Referring to FIG. 5, the semiconductor device according to some exemplary embodiments may additionally include a first insert spacer 148 and a second insert spacer 248.

The first insert spacer 148 may be formed between the first fin-type pattern 110 and a lower surface 140b of the first gate spacer 140, and between the first fin-type pattern 110 and a lower surface 145b of the second gate spacer 145.

The second insert spacer 248 may be formed between the first fin-type pattern 110 and a lower surface 240b of the third gate spacer 240, and between the first fin-type pattern 110 and a lower surface 245b of the fourth gate spacer 245.

The first insert spacer 148 may include a material different from the first gate spacer 140 and the second gate spacer 145, and the second insert spacer 248 may include a material different from the third gate spacer 240 and the fourth gate spacer 245.

For example, the upper portion 142 of the first gate spacer and the lower portion 141 of the first gate spacer may each include a material having etch selectivity to the first insert spacer 148.

For example, the first insert spacer 148 and the second insert spacer 248 may include one or more of silicon nitride (SiN), silicon oxynitride (SiON), silicon carbon nitride (SiCN), silicon oxycarbon nitride (SiOCN), silicon boron nitride (SiBN), silicon oxyboron nitride (SiOBN), or silicon oxycarbide (SiOC).

Figure 6:
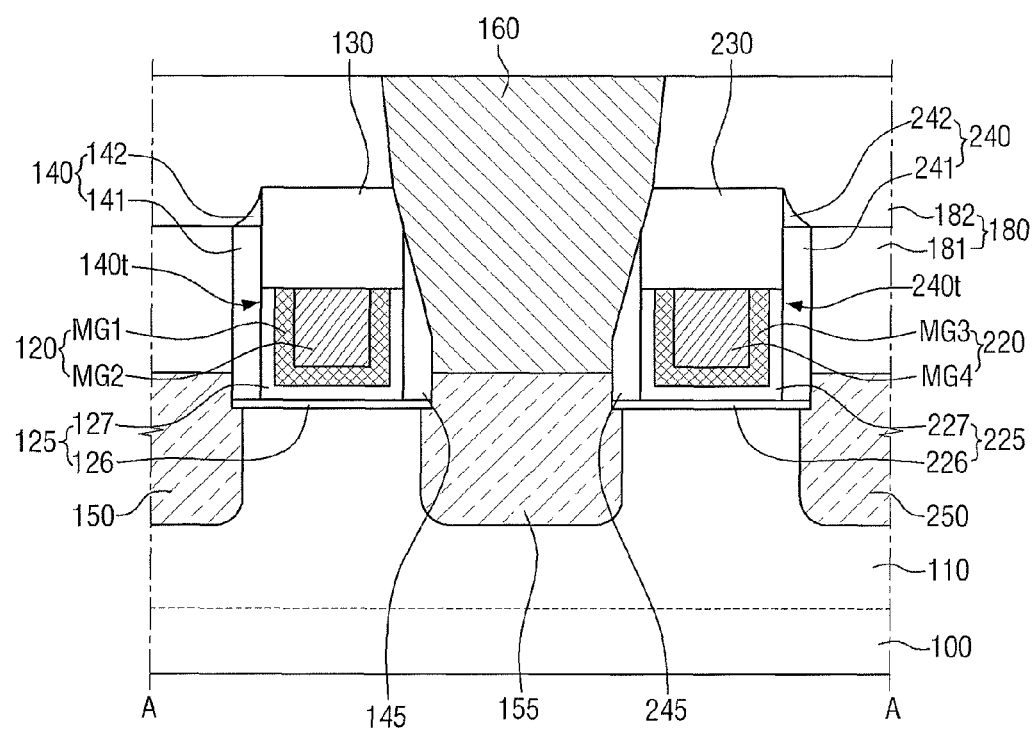
FIG. 6 illustrates a view provided to explain a semiconductor device according to some exemplary embodiments.

FIG. 6 illustrates a view provided to explain a semiconductor device according to some exemplary embodiments. For convenience of explanation, differences that are not explained above with reference to FIGS. 1 to 4 will be mainly explained below.

Referring to FIG. 6, in a semiconductor device according to some exemplary embodiments, the first interfacial layer 126 may extend between the lower surface of the first gate spacer 140 and the first fin-type pattern 110, and between the lower surface of the second gate spacer 145 and the first fin-type pattern 110.

The second interfacial layer 226 may extend between the lower surface of the third gate spacer 240 and the first fin-type pattern 110, and between the lower surface of the fourth gate spacer 245 and the first fin-type pattern 110.

The width in the first direction X (FIG. 1) of the first interfacial layer 126 may be greater than the width of the bottom surface of the first trench 140t, and the width in the first direction X of the second interfacial layer 226 may be greater than the width of the bottom surface of the second trench 240t.

For example, the first interfacial layer 126 and the second interfacial layer 226 may include one or more of silicon nitride (SiN), silicon oxynitride (SiON), silicon carbon nitride (SiCN), silicon oxycarbon nitride (SiOCN), silicon boron nitride (SiBN), silicon oxyboron nitride (SiOBN), or silicon oxycarbide (SiOC).

Figure 7:
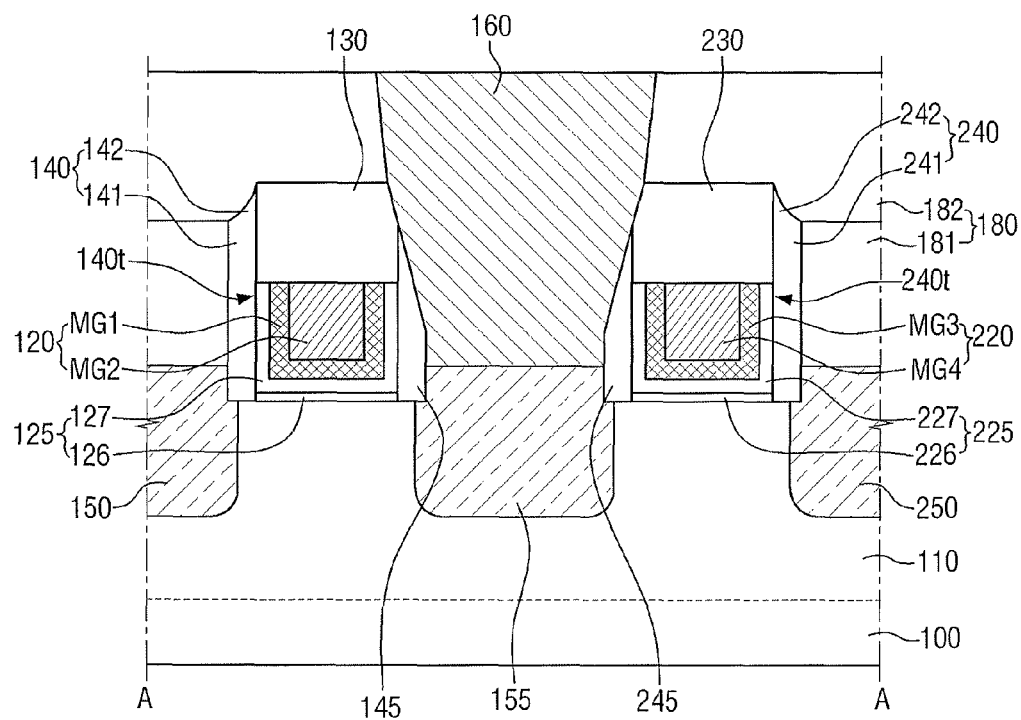
FIG. 7 illustrates a view provided to explain a semiconductor device according to some exemplary embodiments.

FIG. 7 illustrates a view provided to explain a semiconductor device according to some exemplary embodiments. For convenience of explanation, differences that are not explained above with reference to FIGS. 1 to 4 will be mainly explained below.

Referring to FIG. 7, in a semiconductor device according to some exemplary embodiments, the upper portion 142 of the first gate spacer and the lower portion 141 of the first gate spacer may include a same material.

The upper portion 142 of the first gate spacer may have a triangular shape, and a boundary between the upper portion 142 of the first gate spacer and the lower portion 141 of the first gate spacer may be inferred.

Figure 8:
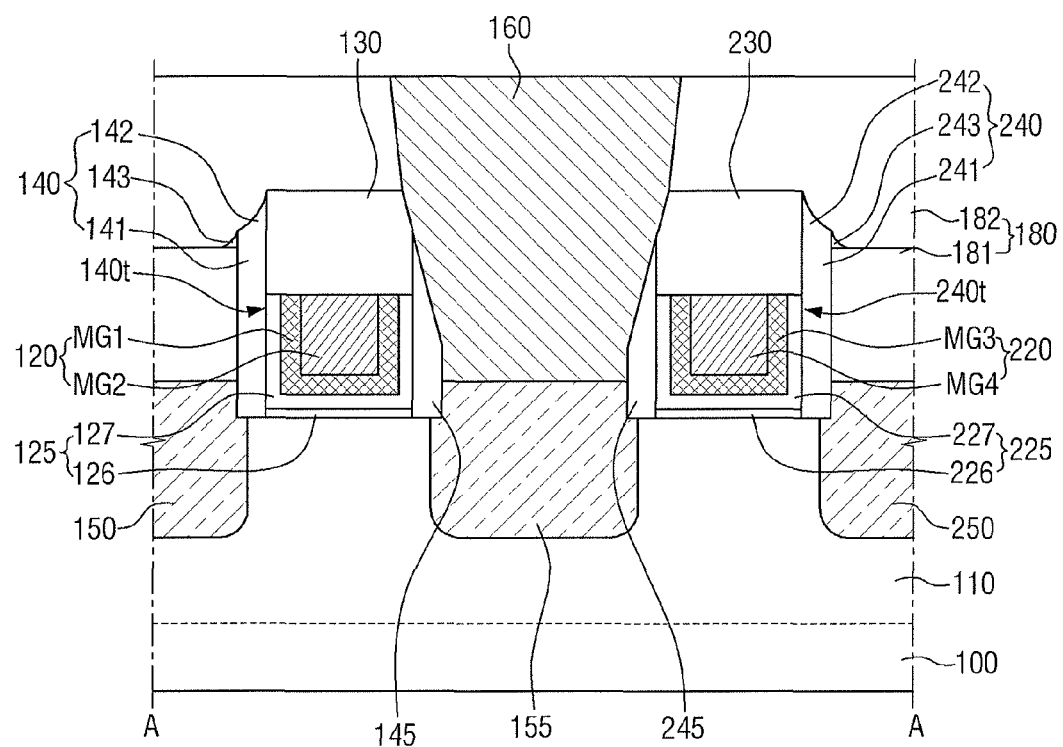
FIG. 8 illustrates a view provided to explain a semiconductor device according to some exemplary embodiments.

FIG. 8 illustrates a view provided to explain a semiconductor device according to some exemplary embodiments. For convenience of explanation, differences that are not explained above with reference to FIGS. 1 to 4 will be mainly explained below.

Referring to FIG. 8, in a semiconductor device according to some exemplary embodiments, the first gate spacer 140 may additionally include a first protruding spacer 143 protruding from an outer sidewall of the lower portion 141 of the first gate spacer.

The first protruding spacer 143 may protrude into the interlayer insulating layer 180, for example, may protrude into the upper interlayer insulating layer 182.

The first protruding spacer 143 may be formed in the self-aligned contact non-forming region, and not formed in the self-aligned contact forming region.

For example, the first protruding spacer 143 may include one or more of silicon nitride (SiN), silicon oxynitride (SiON), silicon oxide ($SiO_2$), silicon carbon nitride (SiCN), silicon oxycarbon nitride (SiOCN), silicon boron nitride (SiBN), silicon oxyboron nitride (SiOBN), or silicon oxycarbide (SiOC).

The first protruding spacer 143 may include a material different from the lower portion 141 of the first gate spacer. In an embodiment, the first protruding spacer 143 may include the same material as the upper portion 142 of the first gate spacer.

The first protruding spacer 143 may be formed in a fabrication process different from the lower portion 141 of the first gate spacer, but may be formed in the same fabrication process as the upper portion 142 of the first gate spacer.

For example, in the self-aligned contact non-forming region, the third gate spacer 240 may, like the first gate spacer 140, additionally include a second protruding spacer 243 protruding from an outer sidewall of the lower portion 241 of the third gate spacer into the interlayer insulating layer 180.

Figure 9:
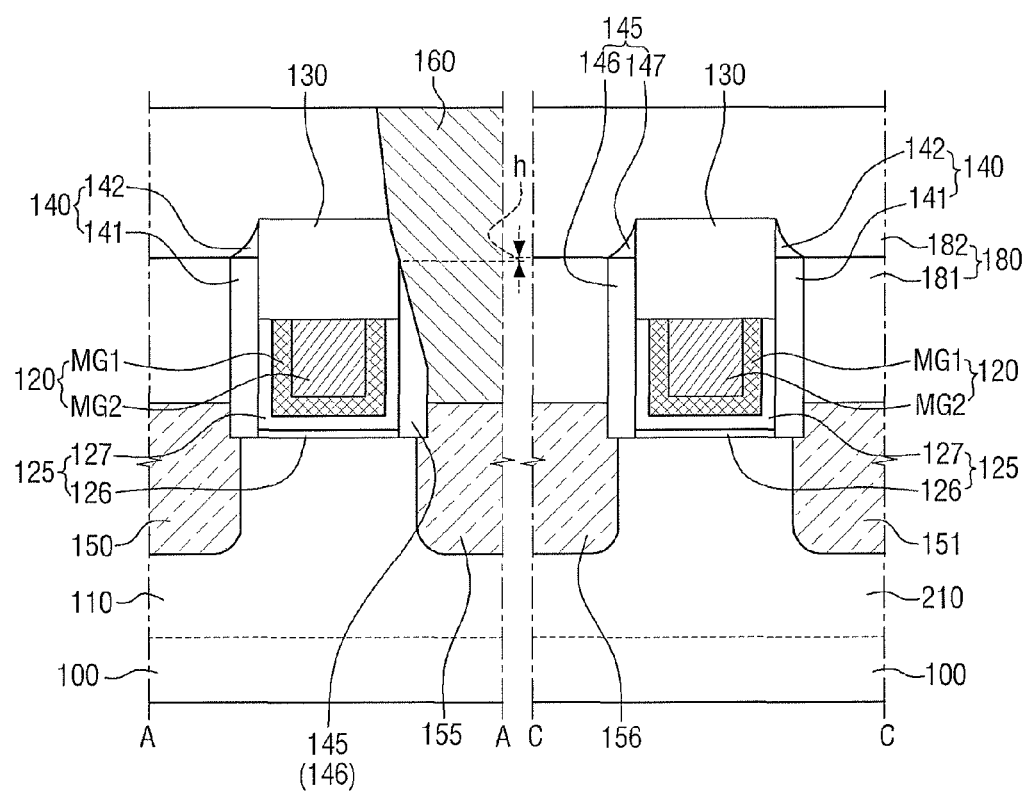
FIG. 9 illustrates a view provided to explain a semiconductor device according to some exemplary embodiments.

FIG. 9 illustrates a view provided to explain a semiconductor device according to some exemplary embodiments. For convenience of explanation, differences that are not explained above with reference to FIGS. 1 to 4 will be mainly explained below.

Referring to FIG. 9, in a semiconductor device according to some exemplary embodiments, the first gate electrode 120, the first gate spacer 140, and the second gate spacer 145 may intersect the second fin-type pattern 210.

As illustrated in section A-A of FIG. 9, the second gate spacer 145 may be positioned in the self-aligned contact forming region. In an embodiment, as illustrated in section C-C of FIG. 9, the second gate spacer 145 may be positioned in the self-aligned contact non-forming region.

Based on the definition that the area other than the self-aligned contact forming region is the self-aligned contact non-forming region, section A-A in FIG. 9 and section C-C in FIG. 9 may be the cross sectional views of the adjacent regions.

In the self-aligned contact forming region, the second gate spacer 145 contacts the first self-aligned contact 160, but in the self-aligned contact non-forming region, the second gate spacer 145 does not contact the self-aligned contact.

For example, in the self-aligned contact non-forming region, the second gate spacer 145 may include a lower portion 146 and an upper portion 147 positioned in a sequential order on the upper surface of the second fin-type pattern 210.

In the self-aligned contact non-forming region, the width of the upper portion 147 of the second gate spacer may decrease, as the direction increases farther away from the upper surface of the second fin-type pattern 210, In the self-aligned contact non-forming region, the outer sidewall of the upper portion 147 of the second gate spacer may contact the interlayer insulating layer 180.

In the self-aligned contact forming region, the second gate spacer 145 may not include a portion that may correspond to the upper portion 147 of the second gate spacer. For example, the second gate spacer 145 in the self-aligned contact forming region may only include a portion that corresponds to the lower portion 146 of the second gate spacer in the self-aligned contact non-forming region.

During the contact hole forming process to form the first self-aligned contact 160, a portion of the lower portion 146 of the second gate spacer may be partially etched, and a height difference (h) between the lower portion 146 of the second gate spacer in the self-aligned contact forming region and the lower portion 146 of the second gate spacer in the self-aligned contact non-forming region may be equal to or greater than 0.

The fourth source/drain region 151 may be adjacent to the first gate spacer 140 and may be formed within the second fin-type pattern 210. The fifth source/drain region 156 may be adjacent to the second gate spacer 145 and may be formed within the second fin-type pattern 210.

In section C-C of FIG. 9, the self-aligned contact vertically overlapped with the fourth source/drain region 151 and the fifth source/drain region 156, may not be formed.

As illustrated in FIGS. 1 and 9, the upper portion 147 of the second gate spacer may be formed along the sidewall of the first gate electrode 120, and on the lower portion 146 of the second gate spacer. In an embodiment, the upper portion 147 of the second gate spacer may be removed at locations where the first self-aligned contact 160 and the second self-aligned contact 163 are formed.

Even the second gate spacer 145 formed on the sidewall of the first gate electrode 120 may change shape thereof, according to whether the second gate spacer 145 is positioned in the self-aligned contact forming region, or in the self-aligned contact non-forming region.

Figure 10:
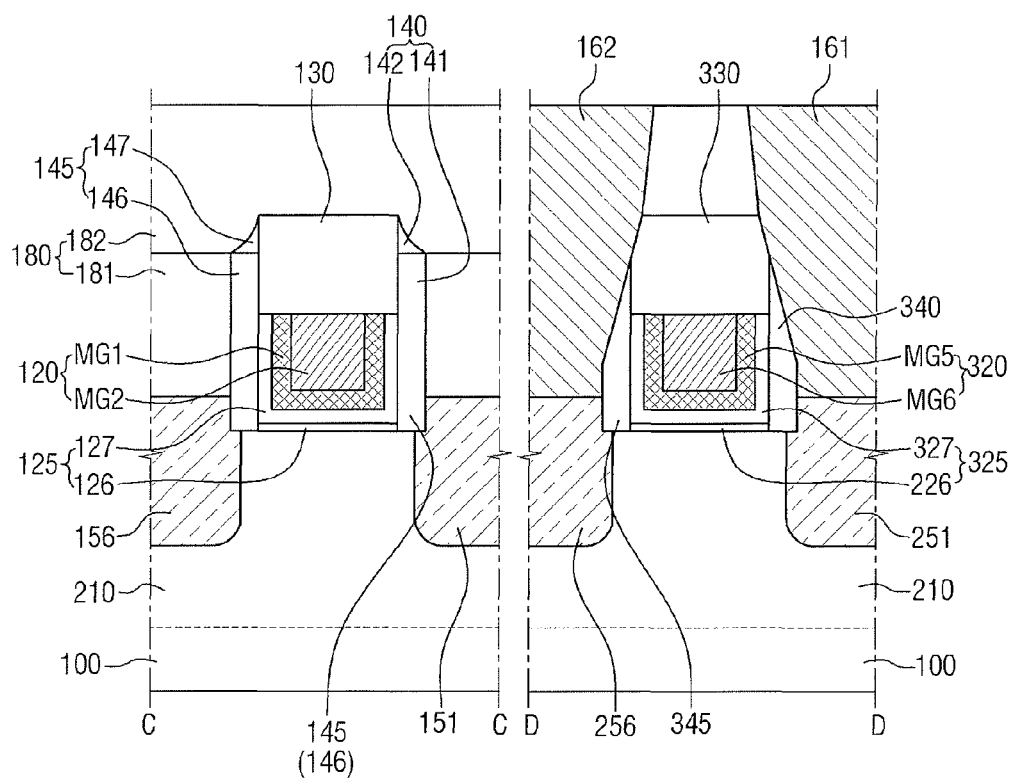
FIG. 10 illustrates a view provided to explain a semiconductor device according to some exemplary embodiments.

FIG. 10 illustrates a view provided to explain a semiconductor device according to some exemplary embodiments. For convenience of explanation, differences that are not explained above with reference to FIGS. 1 to 4 will be mainly explained below.

For reference, section C-C of FIG. 10 may be the section cut along the second fin-type pattern 210, and that of FIG. 2 may be the section cut along the first fin-type pattern 110. Description of the first gate spacer 140 may be substantially identical, and will not be redundantly described for the sake of brevity.

Referring to FIG. 10, in a semiconductor device according to some exemplary embodiments, the second gate spacer 145 in the self-aligned contact non-forming region may include a lower portion 146 and an upper portion 147 positioned in a sequential order on the upper surface of the second fin-type pattern 210.

As the distance increases farther away from the upper surface of the second fin-type pattern 210, the width of the upper portion 147 of the second gate spacer may decrease.

In the self-aligned contact non-forming region, the outer sidewall of the upper portion 147 of the second gate spacer may contact the interlayer insulating layer 180.

The fourth source/drain region 151 may be adjacent to the first gate spacer 140 and may be formed within the second fin-type pattern 210. The fifth source/drain region 156 may be adjacent to the second gate spacer 145 and may be formed within the second fin-type pattern 210.

In section C-C of FIG. 10, the self-aligned contact vertically overlapped with the fourth source/drain region 151 and the fifth source/drain region 156, may not be formed.

The fifth gate spacer 340 and the sixth gate spacer 345 may be formed on the second fin-type pattern 210, respectively. The fifth gate spacer 340 and the sixth gate spacer 345 may intersect the second fin-type pattern 210.

The fifth gate spacer 340 and the sixth gate spacer 345, which are spaced apart from each other, may define a third trench 340t.

The third gate insulating layer 325 may be formed along a sidewall and a bottom surface of the third trench 340t. The third gate insulating layer 325 may include a second interfacial layer 326 and a third high-k dielectric insulating layer 327.

The third gate electrode 320 may be formed on the third gate insulating layer 325. The third gate electrode 320 may partially fill the third trench 340t. The third gate electrode 320 may include metal layers MG5, MG6.

The third capping pattern 330 may be formed on the third gate electrode 320 and the first gate insulating layer 325. The third capping pattern 330 may be formed by partially filling the third trench 340t.

The fifth gate spacer 340 and the sixth gate spacer 345 may be formed on the sidewall of the third gate electrode 320 and the sidewall of the third capping pattern 330.

The sixth source/drain region 251 may be formed adjacent to the fifth gate spacer 340. The sixth source/drain region 251 may be formed within the second fin-type pattern 210.

The seventh source/drain region 256 may be formed adjacent to the fifth gate spacer 340. The seventh source/drain region 256 may be formed within the second fin-type pattern 210.

The third and the fourth self-aligned contacts 161, 162 may be formed within the interlayer insulating layer 180. At least a portion of the third self-aligned contact 161 may be overlapped vertically with the sixth source/drain region 251. At least a portion of the fourth self-aligned contact 162 may be overlapped vertically with the seventh source/drain region 256.

The third self-aligned contact 161 may contact the fifth gate spacer 340, and the fourth self-aligned contact 162 may contact the sixth gate spacer 345.

In section C-C of FIG. 10, both sides of the first gate electrode 120 are illustrated as the self-aligned contact non-forming regions. In section D-D of FIG. 10, both sides of the third gate electrode 320 are illustrated as the self-aligned contact forming regions, for example.

FIG. 10 illustrates a cross sectional view cut along the second fin-type pattern 210, for example. In an embodiment, section C-C of FIG. 10 and section D-D of FIG. 10 may be cross sectional views cut along different fin-type patterns from each other.

FIGS. 11A to 19 illustrate views of intermediate stages of fabrication, provided to explain a method for fabricating a semiconductor device according to some exemplary embodiments.

Figure 11A:
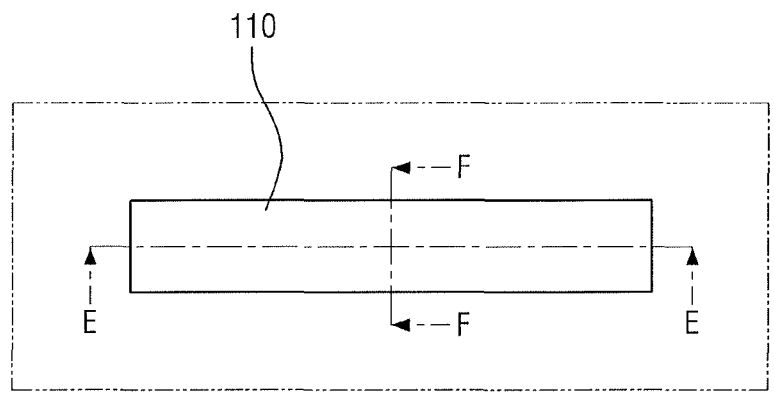
FIGS. 11A-11C, 12A-12B, and 13 to 19 illustrate views of intermediate stages of fabrication, provided to explain a method for fabricating a semiconductor device according to some exemplary embodiments.
Figure 11B:
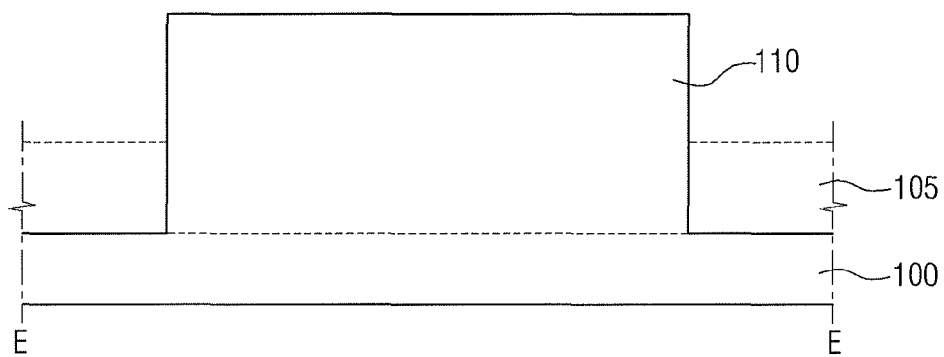
Figure 11C:
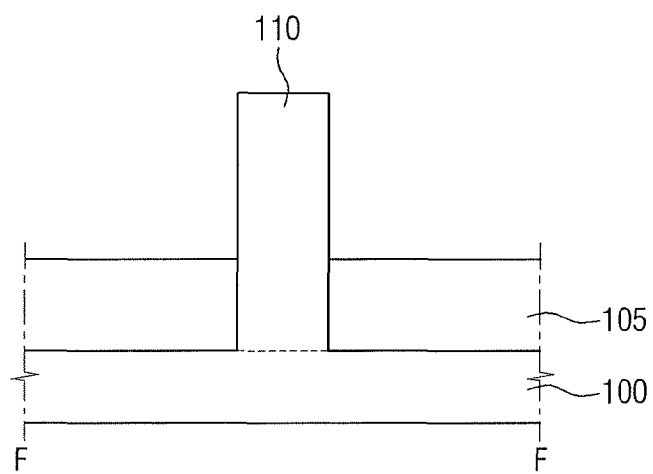

FIG. 11B illustrates a cross sectional view taken on line E-E of FIG. 11A, and FIG. 11C illustrates a cross sectional view taken on line F-F of FIG. 11A.

Referring to FIGS. 11A to 11C, the first fin-type pattern 110 may be formed on the substrate 100. The first fin-type pattern 110 may extend longitudinally in one direction.

The field insulating layer 105 may be formed on the substrate 100. The field insulating layer 105 may partially surround the first fin-type pattern 110.

For example, the first fin-type pattern 110 may include a portion that protrudes upward higher than the upper surface of the field insulating layer 105.

Following description will refer to a cross sectional view taken on line E-E of FIG. 11A and/or to a cross sectional view taken on line F-F of FIG. 11A.

Figure 12A:
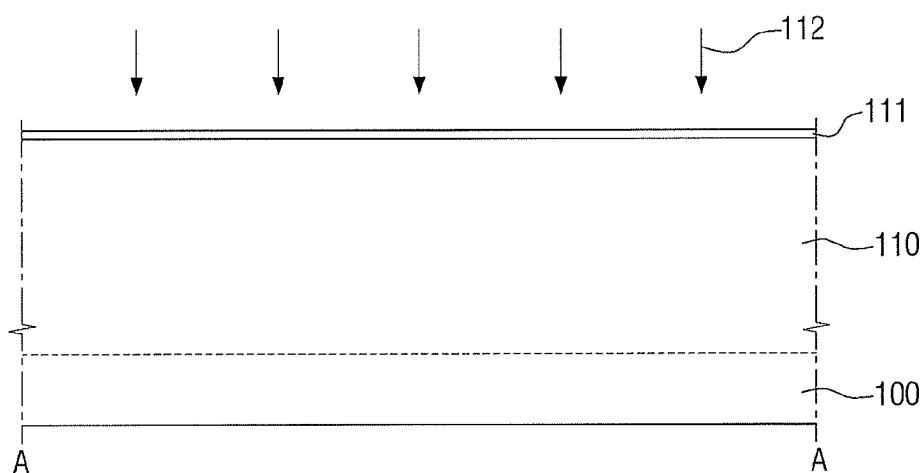
Figure 12B:
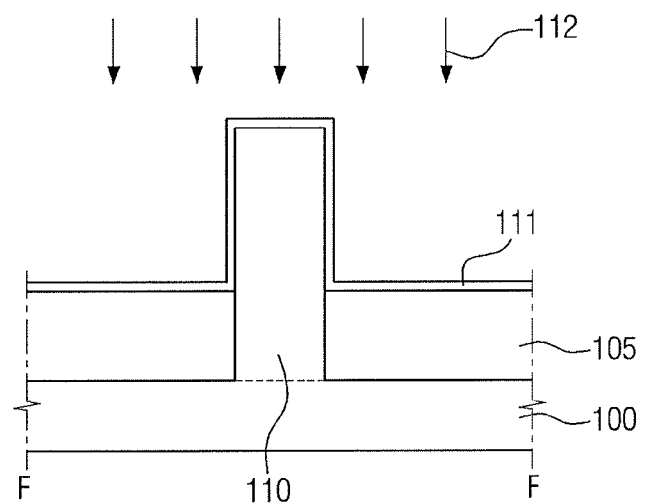

Referring to FIGS. 12A and 12B, a fin-type pattern protective layer 111 may be formed along a profile of the first fin-type pattern 110 protruding further than the upper surface of the field insulating layer 105, and along the upper surface of the field insulating layer 105.

The fin-type pattern protective layer 111 may be formed by using, for example, chemical vapor deposition (CVD) or atomic layer deposition (ALD).

For example, the fin-type pattern protective layer 111 may include one or more of silicon nitride (SiN), silicon oxynitride (SiON), silicon carbon nitride (SiCN), silicon oxycarbon nitride (SiOCN), silicon boron nitride (SiBN), silicon oxyboron nitride (SiOBN), or silicon oxycarbide (SiOC).

Next, impurity may be injected into the first fin-type pattern 110 by using an impurity injection process 112, and it may be possible to adjust, for example, threshold voltage, of the fabricated semiconductor device, by using the first fin-type pattern 110.

Figure 13:
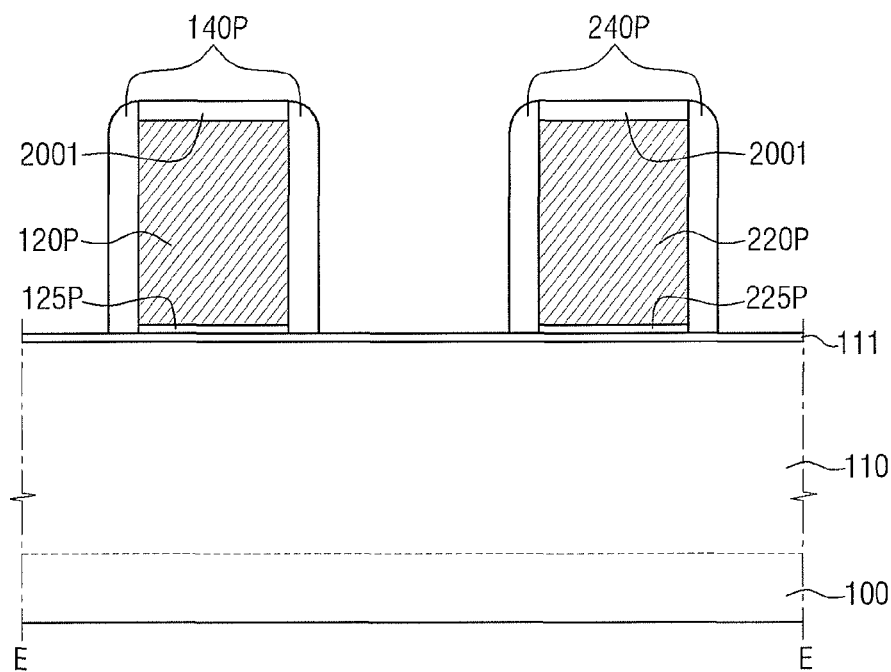

Referring to FIG. 13, etching process may be performed using a mask pattern 2001, thus forming a first dummy gate electrode 120P and a second dummy gate electrode 220P intersecting the first fin-type pattern 110 formed with the fin-type pattern protective layer 111.

The first dummy gate insulating layer 125P may be formed between the first dummy gate electrode 120P and the first fin-type pattern 110, and the second dummy gate insulating layer 225P may be formed between the second dummy gate electrode 220P and the first fin-type pattern 110.

Depending on occasions, the first dummy gate electrode 120P and the second dummy gate electrode 220P may be formed without the first dummy gate insulating layer 125P and the second dummy gate insulating layer 225P.

For example, the first and the second dummy gate insulating layers 125P, 225P may be silicon oxide layers, and the first and the second dummy gate electrodes 120P, 220P may include polysilicon or amorphous silicon, for example.

Next, a first pre-spacer 140P may be formed on the sidewall of the first dummy gate electrode 120, and a second pre-spacer 240P may be formed on the sidewall of the second dummy gate electrode 220P.

Figure 14:
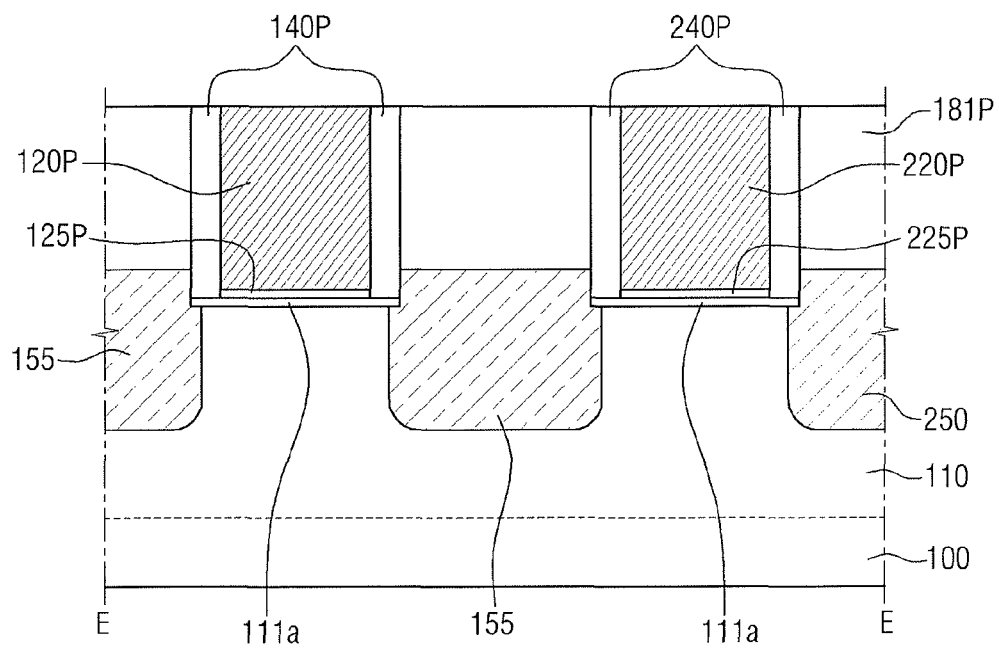

Referring to FIG. 14, the first to the third source/drain regions 150, 155, 250 may be formed within the first fin-type pattern 110, which may not be intersected with the first dummy gate electrode 120P and the second dummy gate electrode 220P.

After forming a recess within the first fin-type pattern 110, an epitaxial layer for filling the recess may be formed by using epitaxial process, and the first to the third source/drain regions 150, 155, 250 may be formed.

While the first to the third source/drain regions 150, 155, 250 are formed, a portion of the fin-type pattern protective layer 111 may be removed, thus forming a patterned fin-type pattern protective layer 111a.

Next, a pre-lower interlayer insulating layer 181P may be formed on the first fin-type pattern 110, covering the first fin-type pattern 110, the first and the second dummy gate electrodes 120P, 220P, and the first to the third source/drain regions 150, 155, 250.

The pre-lower interlayer insulating layer 181P may be planarized until the upper surfaces of the first and the second dummy gate electrodes 120P, 220P are exposed, and the mask pattern 2001 may be removed.

For example, the pre-lower interlayer insulating layer 181P may be formed on the first fin-type pattern 110, exposing the upper surface of the first and the second dummy gate electrodes 120P, 220P.

Figure 15:
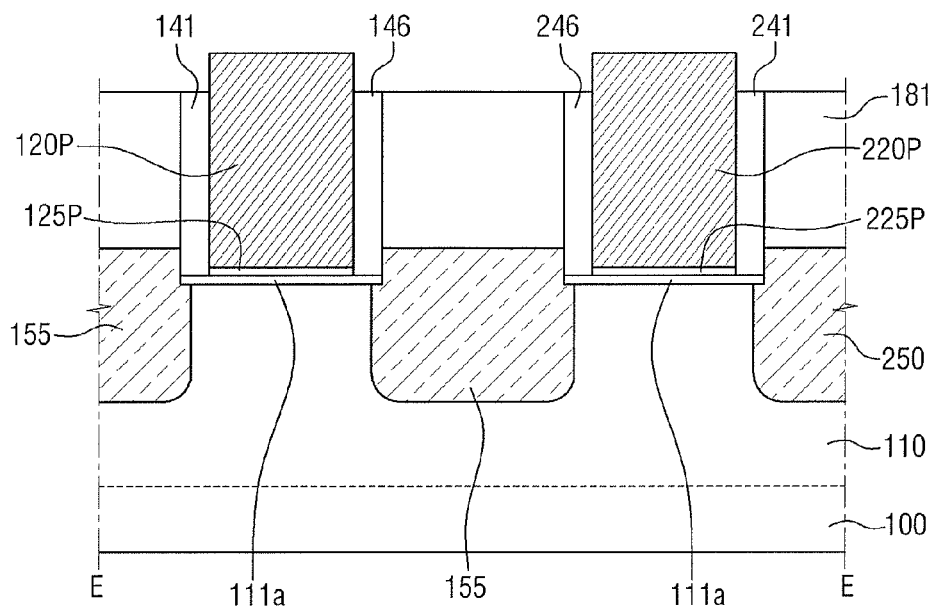

Referring to FIG. 15, a portion of the pre-lower interlayer insulating layer 181P may be recessed so as to form a lower interlayer insulating layer 181.

The first and the second dummy gate electrodes 120P, 220P may be protruded higher than the upper surface of the lower interlayer insulating layer 181.

While a portion of the pre-lower interlayer insulating layer 181P is being recessed, a portion of the first and the second pre-spacers 140P, 240P may also be removed so as to form lower portions 141, 146, 241, 246 of the first to the fourth gate spacers.

As the lower portions 141, 146, 241, 246 of the first to the fourth gate spacers are formed, a portion of the sidewalls of the first and the second dummy gate electrodes 120P, 220P may be exposed.

As illustrated in FIG. 15, the upper surfaces of the lower portions 141, 146, 241, 246 of the first to the fourth gate spacers may be in the same plane as the upper surface of the lower interlayer insulating layer 181, for example.

For example, a portion of the lower portions 141, 146, 241, 246 of the first to the fourth gate spacers may protrude higher than the upper surface of the lower interlayer insulating layer 181.

Figure 16:
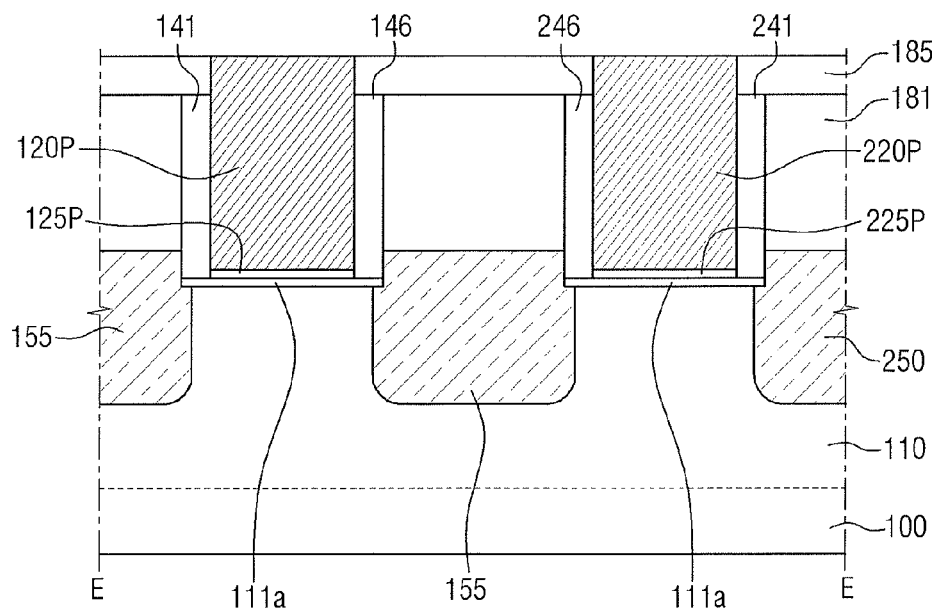

Referring to FIG. 16, a blocking pattern 185 may be formed on the lower interlayer insulating layer 181, surrounding the sidewalls of the exposed, first and second dummy gate electrodes 120P, 220P.

First, a blocking insulating layer that may cover the exposed, first and second dummy gate electrodes 120P, 220P, may be formed. Next, the blocking insulating layer may be planarized until the upper surfaces of the first and the second dummy gate electrodes 120P, 220P are exposed.

For example, the upper surfaces of the first and the second dummy gate electrodes 120P, 220P may be exposed by a blocking pattern 185.

For example, the blocking pattern 185 may include one or more of silicon nitride (SiN), silicon oxynitride (SiON), silicon oxide ($SiO_2$), silicon carbon nitride (SiCN), silicon oxycarbon nitride (SiOCN), silicon boron nitride (SiBN), silicon oxyboron nitride (SiOBN), or silicon oxycarbide (SiOC).

Figure 17:
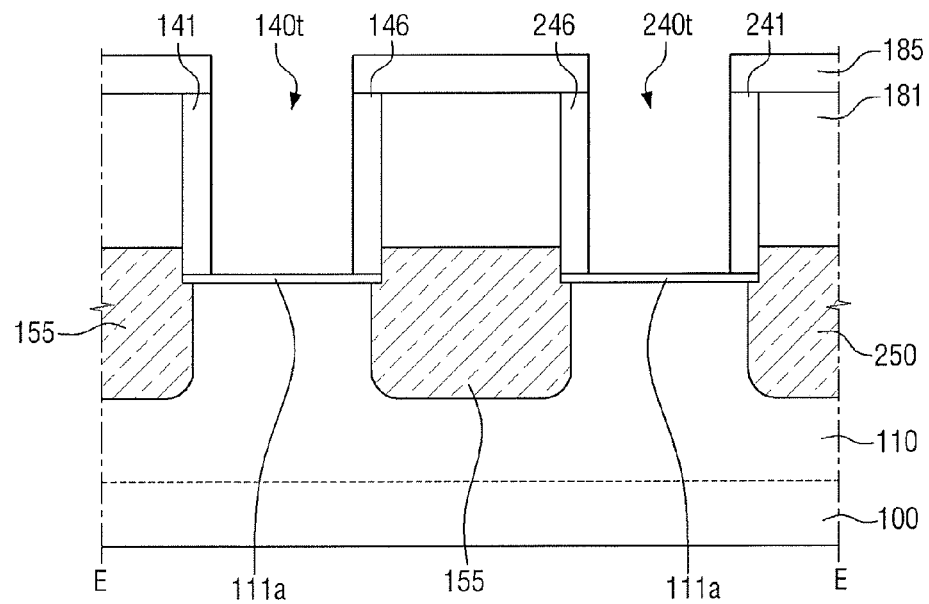

Referring to FIG. 17, the first and the second dummy gate electrodes 120P, 220P and the first and the second dummy gate insulating layers 125P, 225P may be removed, and the patterned fin-type pattern protective layer 111a may be exposed.

The first trench 140t may be formed as the first dummy gate electrode 120P and the first dummy gate insulating layer 125P are removed. The second trench 240t may be formed as the second dummy gate electrode 220P and the second dummy gate insulating layer 225P are removed.

The patterned fin-type pattern protective layer 111a may be exposed by the first trench 140t and the second trench 240t.

Figure 18:
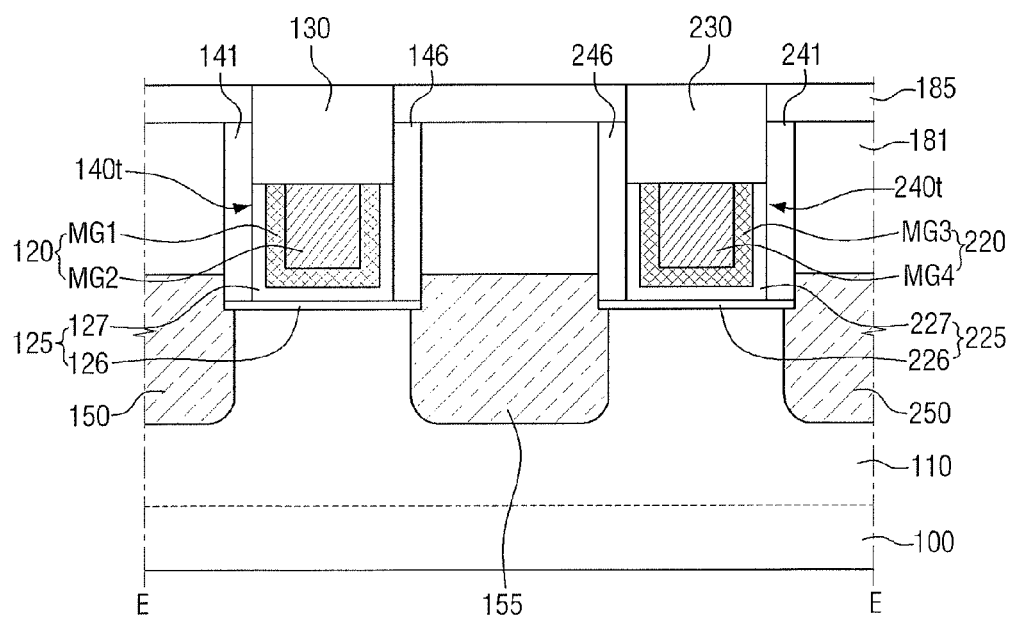

Referring to FIG. 18, the first gate electrode 120 partially filling the first trench 140t, and the second gate electrode 220 partially filling the second trench 240t, may be formed.

The first gate electrode 120 and the second gate electrode 220 may be formed on the patterned fin-type pattern protective layer 111a.

The patterned fin-type pattern protective layer 111a exposed by the first trench 140t and the second trench 240t, may play a role of the first interfacial layer 126 and the second interfacial layer 226, respectively.

The first gate electrode 120 and the second gate electrode 220 may be formed by forming a conductive electrode pattern that may entirely fill the first trench 140t and the second trench 240t, respectively, and then partially removing the conductive electrode pattern.

Next, the first capping pattern 130 for filling the first trench 140t may be formed on the first gate electrode 120. The second capping pattern 230 for filling the second trench 240t may be formed on the second gate electrode 220.

The first capping pattern 130 and the second capping pattern 230 may each include different materials from the blocking pattern 185. For example, the first capping pattern 130 and the second capping pattern 230 may each include materials having etch selectivity relative to the blocking pattern 185. In other words, as may be seen in the resultant structure of FIG. 19, the first and second capping patterns 130 and 230 may be more resistant to etching than the blocking pattern 185 for the etching process used to remove the blocking pattern 185.

The upper surface of the first capping pattern 130, the upper surface of the second capping pattern 230, and the upper surface of the blocking pattern 185, may be positioned in the same plane.

Figure 19:
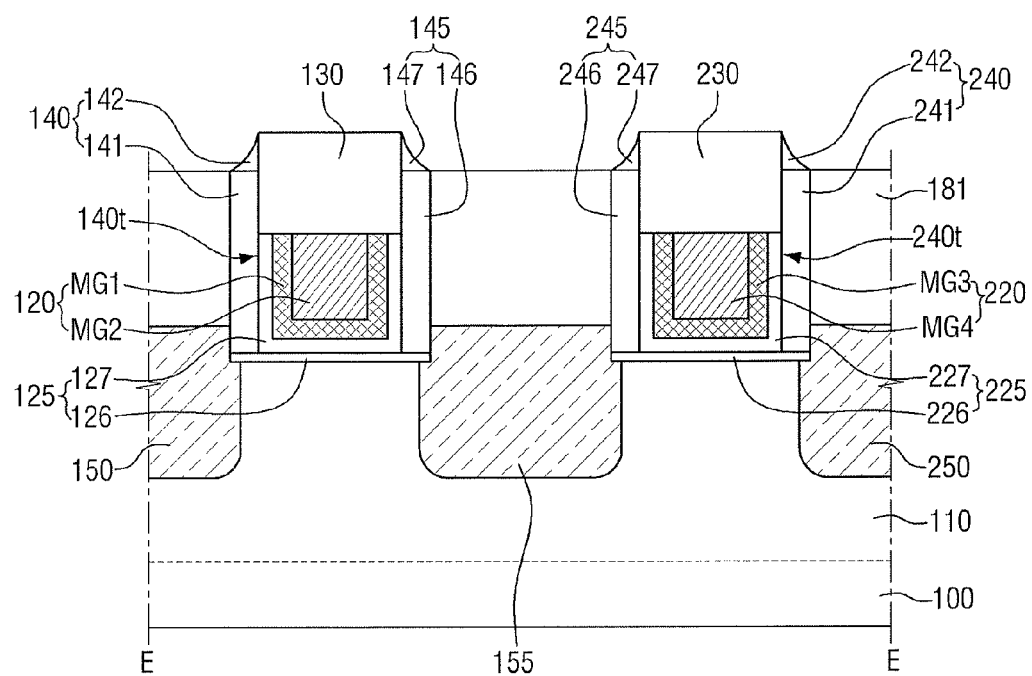

Referring to FIG. 19, while the blocking pattern 185 is being removed, the upper portions 142, 147, 242, 247 of the first to the fourth gate spacers may be formed.

The first and the second gate spacers 142, 147 may be formed on a portion of the sidewall of the first capping pattern 130, and the upper portions 242, 247 of the third and the fourth gate spacers may be formed on a portion of the sidewall of the second capping pattern 230.

The upper portions 142, 147, 242, 247 of the first to the fourth gate spacers may be a portion of the blocking pattern 185 remaining at the boundary portion between the first capping pattern 130 and the second capping pattern 230.

Next, referring to FIG. 6, after the upper interlayer insulating layer 182 is formed, the first self-aligned contact 160 may be formed within the interlayer insulating layer 180.

Figure 20:
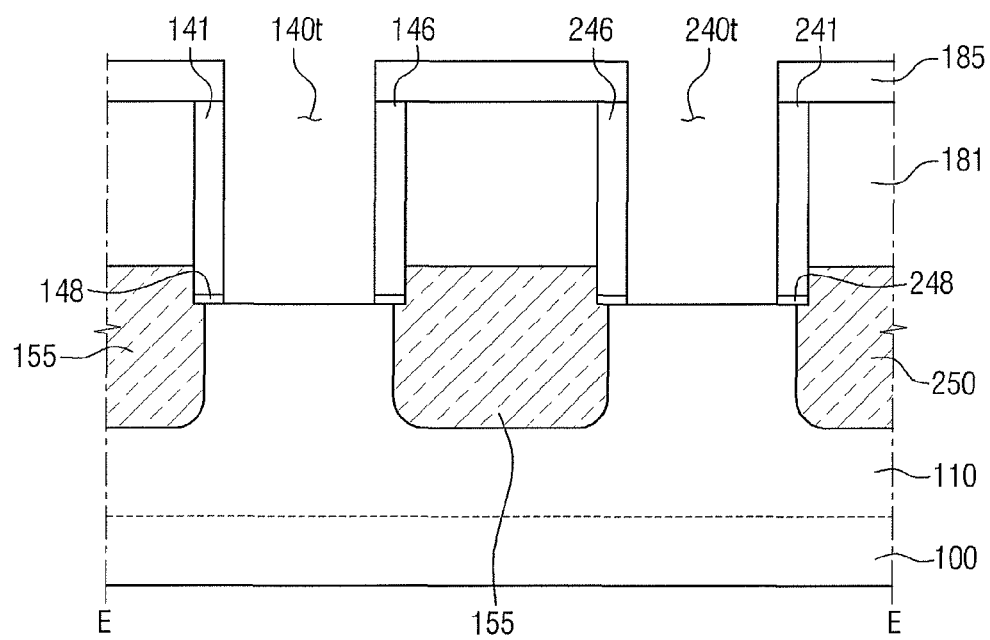
FIG. 20 illustrates a view of intermediate stages of fabrication, provided to explain a method for fabricating a semiconductor device according to some exemplary embodiments.

FIG. 20 illustrates a view of intermediate stages of fabrication, provided to explain a method for fabricating a semiconductor device according to some exemplary embodiments.

For reference, FIG. 20 may involve a stage performed after FIG. 17.

Referring to FIG. 20, the patterned fin-type pattern protective layer 111a exposed by the first trench 140t and the second trench 240t may be removed.

The first insert spacer 148 may be formed between the lower portions 141, 146 of the first and the second gate spacers and the first fin-type pattern 110, and the second insert spacer 248 may be formed between the lower portions 241, 246 of the third and the fourth gate spacers and the first fin-type pattern 110.

The blocking pattern 185 and the lower portions 141, 146, 241, 246 of the first to the fourth gate spacers may include materials different from that of the patterned fin-type pattern protective layer 111a, to prevent removal of the blocking pattern 185 and the lower portions 141, 146, 241, 246 of the first to the fourth gate spacers during removal of the patterned fin-type pattern protective layer 111a.

The blocking pattern 185 and the lower portions 141, 146, 241, 246 of the first to the fourth gate spacers may include materials having etch selectivity relative to the patterned fin-type pattern protective layer 111a. In particular, the blocking pattern 185 and the lower portions 141, 146, 241, 246 may be more resistant to the etching process used to remove the fin-type pattern protective layer 111a than the fin-type pattern protective layer 111a.

Next, stages illustrated in FIGS. 18, 19 and 5 may follow.

Figure 21:
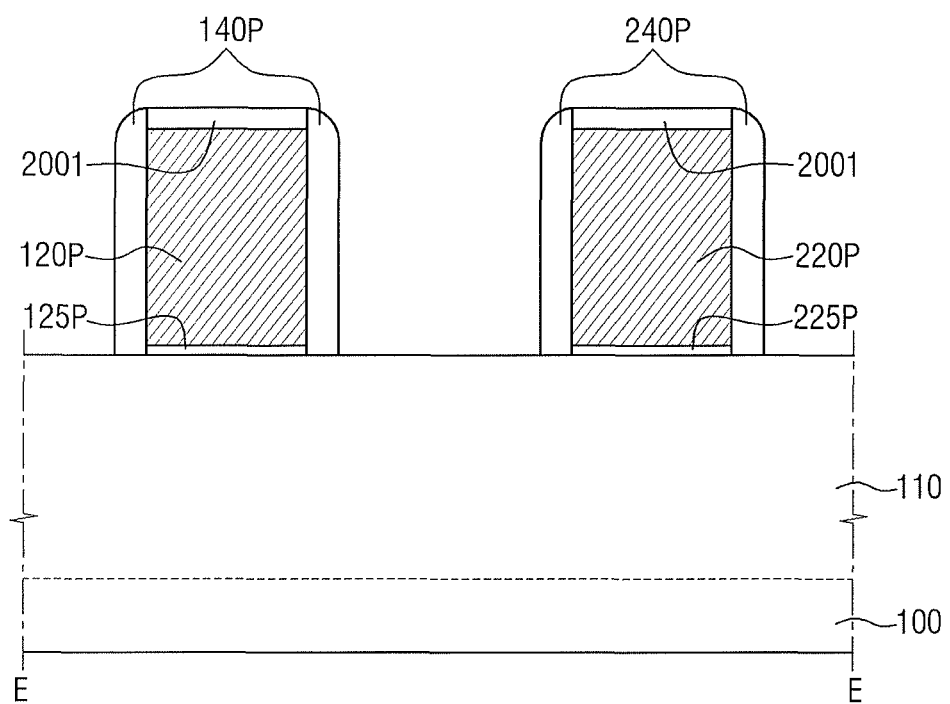
FIG. 21 illustrates a view of intermediate stages of fabrication, provided to explain a method for fabricating a semiconductor device according to some exemplary embodiments.

FIG. 21 illustrates a view of intermediate stages of fabrication, provided to explain a method for fabricating a semiconductor device according to some exemplary embodiments.

For reference, FIG. 20 may involve a stage performed before FIG. 13.

Referring to FIG. 21, after the impurity injection process 112, the fin-type pattern protective layer 111 may be removed.

Next, the first dummy gate electrode 120P and the second dummy gate electrode 220P intersecting the first fin-type pattern 110, may be formed.

Figure 22:
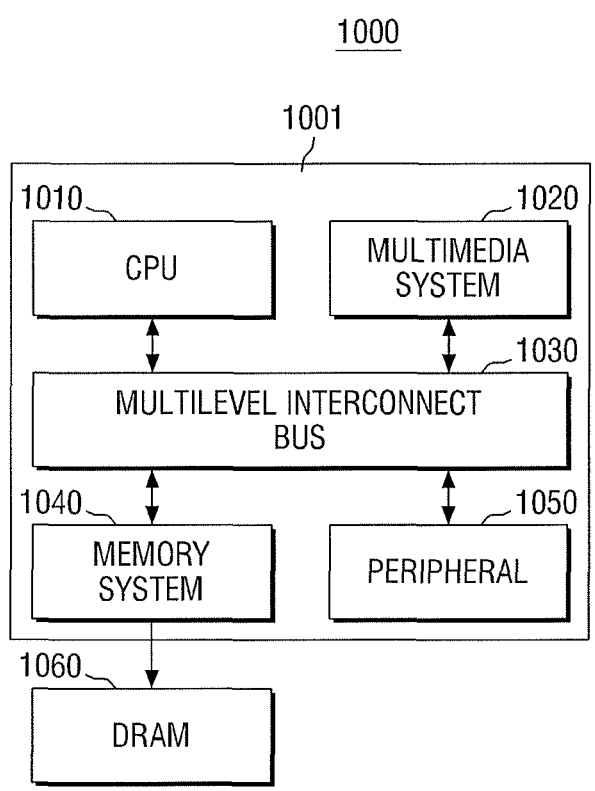
FIG. 22 illustrates a block diagram of a system on chip (SoC) system including a semiconductor device according to exemplary embodiments.

FIG. 22 illustrates a block diagram of an SoC system including a semiconductor device according to exemplary embodiments.

Referring to FIG. 22, the SoC system 1000 may include an application processor 1001 and a DRAM 1060.

The application processor 1001 may include a central processing unit (CPU) 1010, a multimedia system 1020, a bus 1030, a memory system 1040 and a peripheral circuit 1050.

The CPU 1010 may perform arithmetic operations necessary for driving of the SoC system 1000. In some exemplary embodiments, the CPU 1010 may be configured on a multi-core environment which may include a plurality of cores.

The multimedia system 1020 may be used for performing a variety of multimedia functions on the SoC system 1000. The multimedia system 1020 may include a three-dimensional (3D) engine module, a video codec, a display system, a camera system, or a post-processor.

The bus 1030 may be used for exchanging data communication among the CPU 1010, the multimedia system 1020, the memory system 1040 and the peripheral circuit 1050. In some exemplary embodiments, the bus 1030 may have a multi-layer structure. Examples of the bus 1030 include a multi-layer advanced high-performance bus (AHB) and a multi-layer advanced eXtensible interface (AXI).

The memory system 1040 may provide environments necessary for the application processor 1001 to connect to an external memory (e.g., DRAM 1060) and perform high-speed operation. In some exemplary embodiments, the memory system 1040 may include a separate controller (e.g., DRAM controller) to control an external memory (e.g., DRAM 1060).

The peripheral circuit 1050 may provide environments necessary for the SoC system 1000 to have a seamless connection to an external device (e.g., main board), and the peripheral circuit 1050 may include a variety of interfaces to allow compatible operation with the external device connected to the SoC system 1000.

The DRAM 1060 may function as an operation memory necessary for the operation of the application processor 1001. In some exemplary embodiments, the DRAM 1060 may be arranged externally to the application processor 1001, as illustrated. For example, the DRAM 1060 may be packaged into a package on package (PoP) type with the application processor 1001.

At least one of the above-mentioned components of the SoC system 1000 may include at least one of the semiconductor devices according to the exemplary embodiments explained above.

By way of summation and review, operating speed of a semiconductor device may be increased and integration may be enhanced. The semiconductor device may be equipped with discrete devices such as metal oxide semiconductor (MOS) transistors. Due to, for example, continuous integration of the semiconductor device, gates of the MOS transistors may gradually become smaller, and underlying channel regions of the gates may also gradually become narrower.

Such decreasing intervals between gates of the transistor may cause considerably decreasing intervals among the contacts formed on the gate of the transistor and the source/drain of the transistor.

An exemplary embodiment may provide a semiconductor device, which may provide enhanced operating performance, by alleviating variation in the height of a replacement metal gate electrode.

An exemplary embodiment may provide a method for fabricating a semiconductor device, which may alleviate loss of an interlayer insulating layer in the process of forming a replacement metal gate electrode. A resultant semiconductor device may include gate spacers defining a trench and the gate electrode may have distinctive features, e.g., having different heights or having different outer sidewall shapes.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a first fin-type pattern;
   a first gate spacer on the first fin-type pattern, the first gate spacer including an upper portion and a lower portion;
   a second gate spacer on the first fin-type pattern, the second gate spacer being spaced apart from the first gate spacer;
   a first trench defined by the first gate spacer and the second gate spacer;
   a gate insulating layer along a bottom surface and a sidewall of the first trench;
   a first gate electrode on the gate insulating layer, the first gate electrode partially filling the first trench;

a capping pattern on the first gate electrode, the capping pattern filling the first trench;

an interlayer insulating layer covering an upper surface of the capping pattern; and a protruding spacer protruding from a sidewall of the lower portion of the first gate spacer into the interlayer insulating layer, wherein:

a width of the upper portion of the first gate spacer decreases as a distance from an upper surface of the first fin-type pattern increases, an outer sidewall of the upper portion of the first gate spacer contacting the interlayer insulating layer, a height of the first gate spacer from the upper surface of the first fin-type pattern and a height of the second gate spacer from the upper surface of the first fin-type pattern are different from each other, and the protruding spacer includes a different material from the lower portion of the first gate spacer, and includes a same material as the upper portion of the first gate spacer.

2. The semiconductor device as claimed in claim 1, further comprising a source/drain region adjacent to the first gate spacer, the source/drain region being within the first fin-type pattern, wherein a self-aligned contact vertically overlapping the source/drain region, is not formed.

3. The semiconductor device as claimed in claim 1, wherein the capping pattern includes a different material from the upper portion of the first gate spacer such that the capping pattern is more resistant to an etching process than the upper portion of the first gate spacer.

4. The semiconductor device as claimed in claim 1, wherein a thickness of the upper portion of the first gate spacer is less than a thickness of the capping pattern.

5. The semiconductor device as claimed in claim 1, wherein the lower portion of the first gate spacer is on a portion of the sidewall of the capping pattern, and on the sidewall of the first gate electrode.

6. The semiconductor device as claimed in claim 1, further comprising an insert spacer between a lower surface of the first gate spacer and the first fin-type pattern, and between a lower surface of the second gate spacer and the first fin-type pattern, wherein the insert spacer includes a different material from the first gate spacer.

7. The semiconductor device as claimed in claim 1, wherein the lower portion of the first gate spacer and the upper portion of the first gate spacer include a same material.

8. The semiconductor device as claimed in claim 1, further comprising:

a source/drain region adjacent to the second gate spacer, the source/drain region being within the first fin-type pattern, and a self-aligned contact vertically overlapped with the source/drain region, the self-aligned contact contacting the second gate spacer.

9. A semiconductor device, comprising:

a first fin-type pattern;

a first gate spacer on the first fin-type pattern, the first gate spacer including an upper portion and a lower portion;

a second gate spacer on the first fin-type pattern, a height of the first gate spacer from an upper surface of the first fin-type pattern being greater than a height of the second gate spacer from the upper surface of the first fin-type pattern;

a first trench defined by the first gate spacer and the second gate spacer;

a gate insulating layer along a bottom surface and a sidewall of the first trench;

a first gate electrode on the gate insulating layer, the first gate electrode partially filling the first trench;

a capping pattern on the first gate electrode; and a protruding spacer protruding from a sidewall of the lower portion of the first gate spacer into an interlayer insulating layer, wherein the protruding spacer includes a different material from the lower portion of the first gate spacer, and includes a same material as the upper portion of the first gate spacer.

10. The semiconductor device as claimed in claim 9, wherein:

a width of the upper portion of the first gate spacer decreases as a distance from the upper surface of the first fin-type pattern increases.

11. The semiconductor device as claimed in claim 10, wherein a thickness of the upper portion of the first gate spacer is less than a thickness of the capping pattern.

12. The semiconductor device as claimed in claim 11, wherein:

each of the first gate spacer and the second gate spacer includes SiOCN; and the capping pattern includes SiN.

* * * * *